(12) United States Patent
Lin et al.

(10) Patent No.: US 12,057,475 B2
(45) Date of Patent: Aug. 6, 2024

(54) FIELD EFFECT TRANSISTOR INCLUDING A DOWNWARD-PROTRUDING GATE ELECTRODE AND METHODS FOR FORMING THE SAME

(71) Applicant: Taiwan Semiconductor Manufacturing Company Limited, Hsinchu (TW)

(72) Inventors: HsinFu Lin, Hsinchu (TW); Tsung-Hao Yeh, Hsinchu (TW); Shiang-Hung Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 260 days.

(21) Appl. No.: 17/471,280

(22) Filed: Sep. 10, 2021

(65) Prior Publication Data

US 2022/0293729 A1  Sep. 15, 2022

Related U.S. Application Data

(60) Provisional application No. 63/159,681, filed on Mar. 11, 2021.

(51) Int. Cl.
| | | |
|---|---|---|
| H01L 29/06 | (2006.01) | |
| H01L 27/12 | (2006.01) | |
| H01L 29/08 | (2006.01) | |
| H01L 29/10 | (2006.01) | |
| H01L 29/40 | (2006.01) | |

(Continued)

(52) U.S. Cl.
CPC ...... *H01L 29/0653* (2013.01); *H01L 29/0615* (2013.01); *H01L 29/0847* (2013.01); *H01L 29/1033* (2013.01)

(58) Field of Classification Search
CPC ............. H01L 27/1203; H01L 29/7824; H01L 29/66659; H01L 29/66681; H01L 29/7835; H01L 29/404; H01L 29/407; H01L 29/42356; H01L 29/1033; H01L 29/66477; H01L 29/78; H01L 29/0642;
(Continued)

(56) References Cited

U.S. PATENT DOCUMENTS

2009/0283825 A1* 11/2009 Wang ................ H01L 29/66659
257/E29.256
2014/0097492 A1* 4/2014 Yu ....................... H01L 29/7835
257/E29.261

(Continued)

*Primary Examiner* — Sonya McCall-Shepard
(74) *Attorney, Agent, or Firm* — The Marbury Law Group, PLLC

(57) ABSTRACT

A field effect transistor contains a semiconductor material layer including a source-side doped well, a source region, and a drain region. A shallow trench isolation structure is embedded in the semiconductor material layer and extends between the source region and the drain region. A gate dielectric layer overlies the semiconductor material layer. A horizontally-extending portion of a gate electrode overlies the gate dielectric layer, and at least one downward-protruding portion of the gate electrode extends downward from a bottom surface of the horizontally-extending portion into an upper region of the shallow trench isolation structure. The gate electrode is vertically spaced from a bottom surface of the shallow trench isolation structure modifies electrical field in a semiconductor channel to reduce hot carrier injection.

20 Claims, 22 Drawing Sheets

(51) Int. Cl.
*H01L 29/417* (2006.01)
*H01L 29/423* (2006.01)
*H01L 29/66* (2006.01)
*H01L 29/78* (2006.01)

(58) Field of Classification Search
CPC ............ H01L 29/0649; H01L 29/0653; H01L 29/7825; H01L 29/4236; H01L 29/0607; H01L 29/0638; H01L 21/743; H01L 21/76802; H01L 21/76877; H01L 29/1087; H01L 29/7816; H01L 29/4175; H01L 29/0615; H01L 29/0843–0886; H01L 21/823431; H01L 21/823821; H01L 21/823468; H01L 21/823864

See application file for complete search history.

(56) References Cited

U.S. PATENT DOCUMENTS

| | | | |
|---|---|---|---|
| 2015/0243777 A1* | 8/2015 | Fujii | H01L 29/4236 257/337 |
| 2018/0175192 A1* | 6/2018 | Fujii | H01L 29/4236 |
| 2018/0233514 A1* | 8/2018 | Lee | H01L 29/66681 |
| 2018/0337276 A1* | 11/2018 | Huang | H01L 29/7825 |
| 2019/0067476 A1* | 2/2019 | Mori | H01L 29/0696 |
| 2019/0259830 A1* | 8/2019 | Parthasarathy | H01L 29/063 |
| 2019/0305129 A1* | 10/2019 | Uda | H01L 29/0607 |
| 2022/0069077 A1* | 3/2022 | Lin | H01L 29/66681 |
| 2023/0083880 A1* | 3/2023 | Tanaka | H01L 29/0696 257/506 |

* cited by examiner

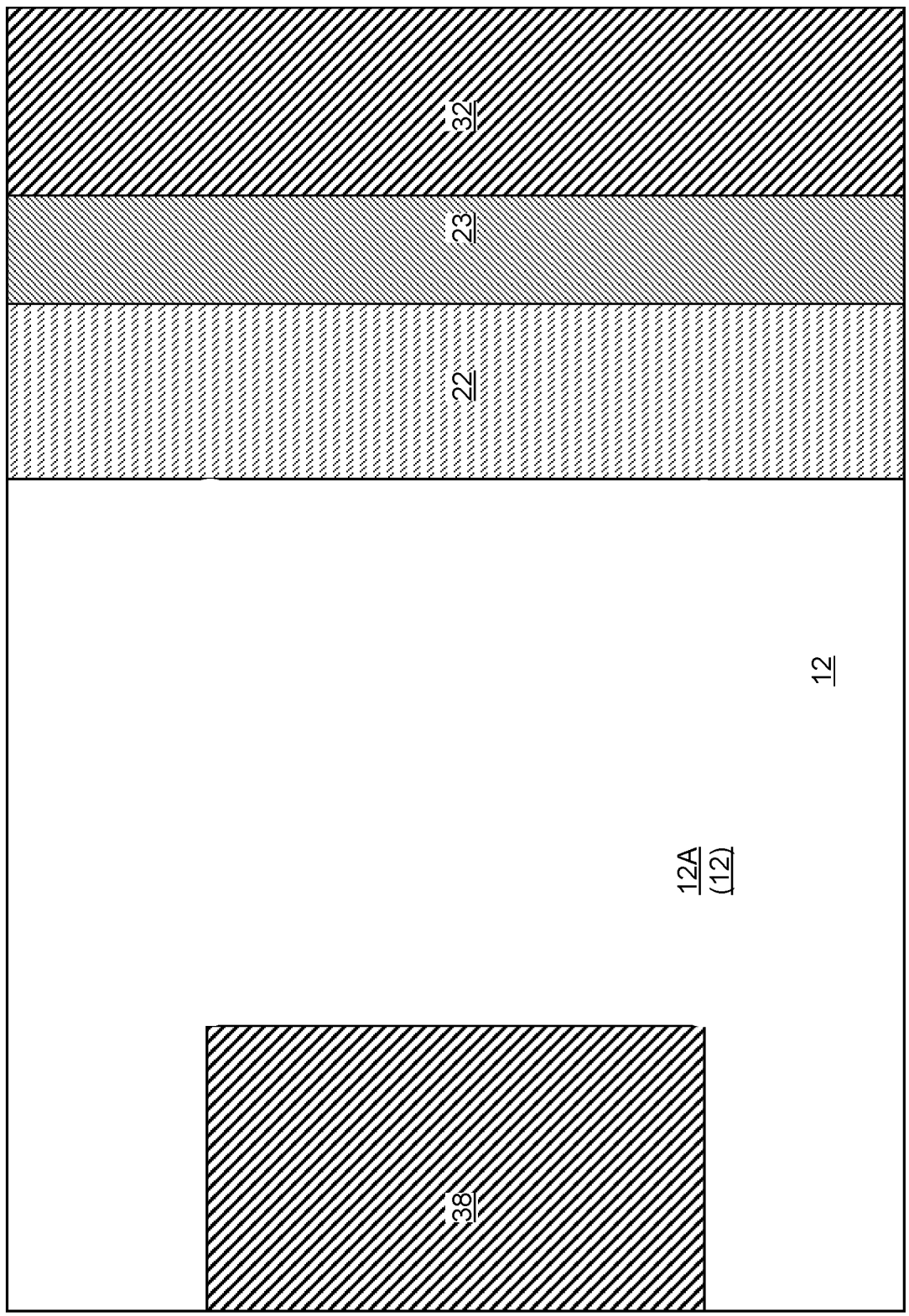

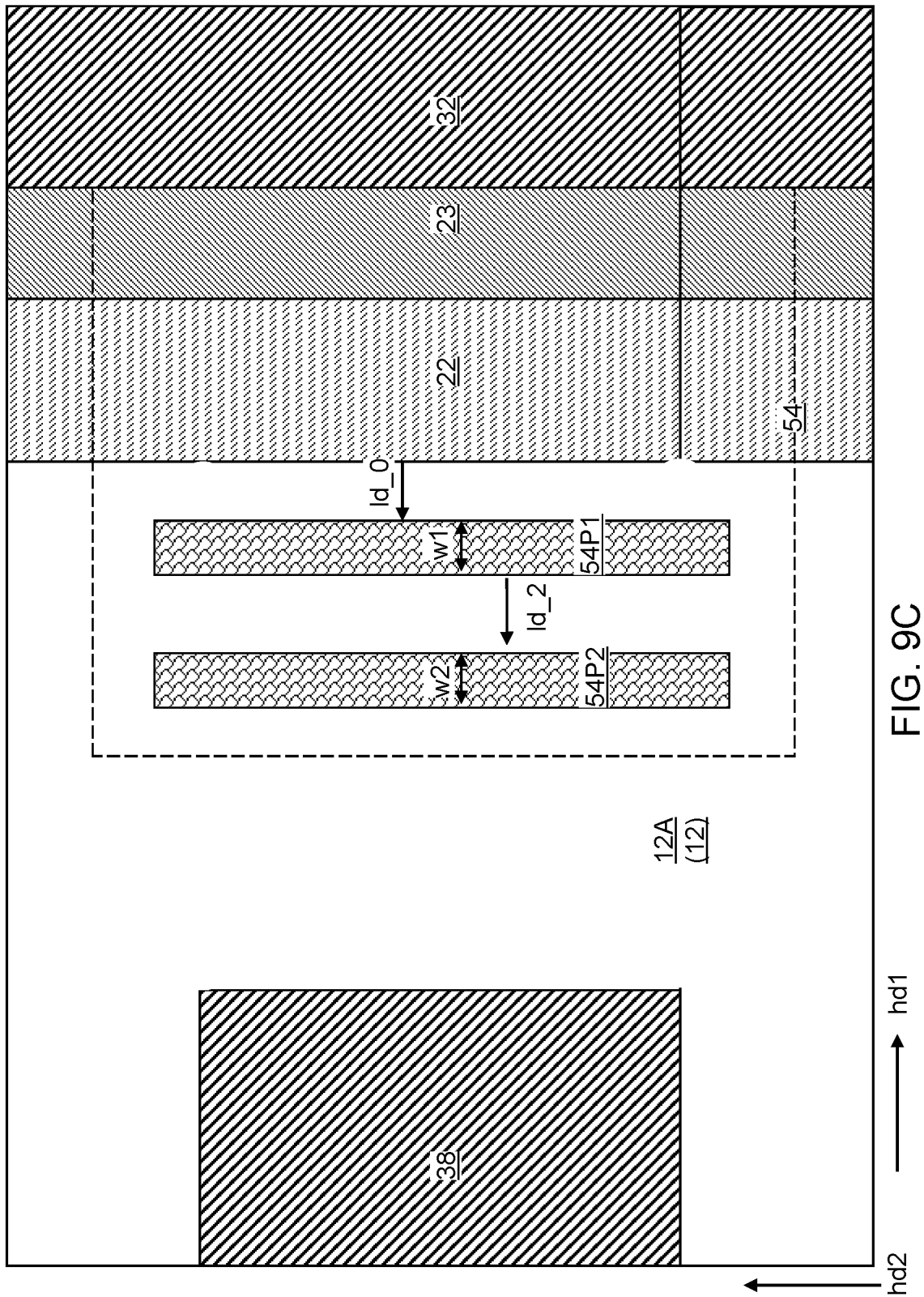

FIELD EFFECT TRANSISTOR INCLUDING A DOWNWARD-PROTRUDING GATE ELECTRODE AND METHODS FOR FORMING THE SAME

RELATED APPLICATIONS

This application claims the benefit of priority from U.S. Provisional Application No. 63/159,681, entitled "Methods for Enhancing Breakdown Voltage and Reducing Hot Carrier Damage in Power Devices," filed on Mar. 11, 2021, the entire contents of which are incorporated herein by reference for all purposes.

BACKGROUND

High voltage field effect transistors are used as power devices that provide high switching power. Breakdown of high voltage field effect transistors may occur through hot carrier-induced damage on the drain side of a gate dielectric layer. Thus, reduction of hot carrier-induced damage to the gate dielectric layer may be desired to provide high reliability and long operational life for high voltage field effect transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6C is a top-down view of the portion of the exemplary structure illustrated in FIG. 6B.

FIG. 9C is a horizontal cross-sectional view of the exemplary structure along the horizontal plane C-C' of FIG. 9B.

DETAILED DESCRIPTION

Figure 1:
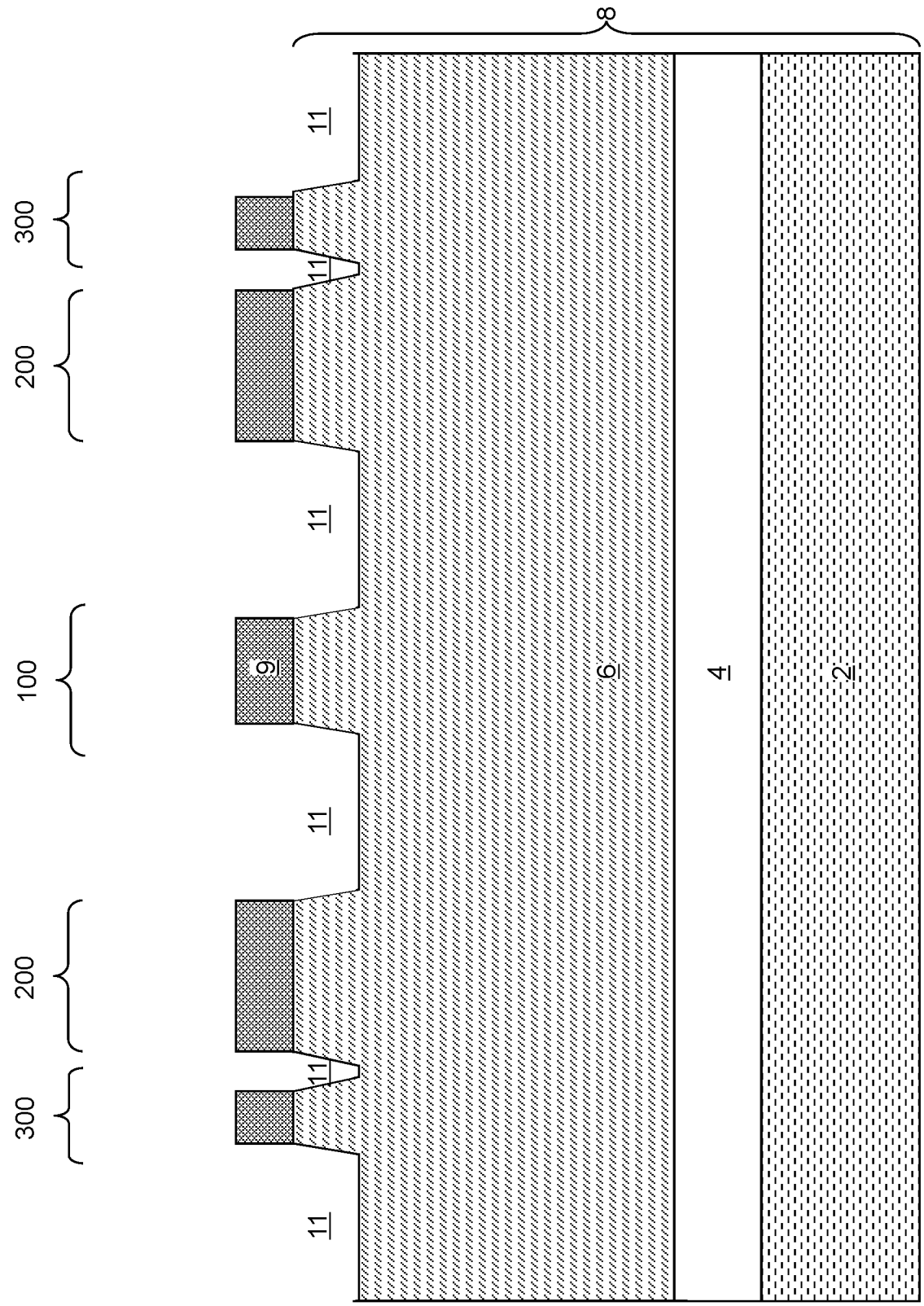
FIG. 1 is a vertical cross-sectional view of an exemplary structure after formation of shallow trenches according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise. Embodiments of the present disclosure are directed to a field effect transistor including a downward-protruding gate electrode and methods for forming the same, the various aspects of which are now described in detail.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. An "active region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active region extension" refers to a source extension region or a drain extension region.

According to an aspect of the present disclosure, the structures and methods of embodiments of the present disclosure may be used to enhance the boost breakdown voltage and to reduce hot carrier damage during operation of a power device such as a field effect transistor used for a high voltage operation. Power devices are generally designed to have a high breakdown voltage. By mitigating hot carrier damage during operation of power devices, performance and reliability of the power devices may be enhanced. According to an aspect of the present disclosure, the contour of the equipotential lines within a field effect structure may be rearranged to provide an electrical field with enhanced uniformity in the field strength in a drift region. The structures and methods of the present disclosure may be used to increase a breakdown voltage by about 10 V in typical operational conditions, and to reduce impact ionization by about an order of magnitude.

The various embodiments of the present disclosure provides at least one downward-protruding portion of a gate electrode over a drift region of a field effect transistor to increase the breakdown voltage and to reduce hot carrier damage during operation. The field effect transistor of the present disclosure may provide effective switching with a smaller device area and enhanced reliability.

Referring to FIG. 1, an exemplary structure according to an embodiment of the present disclosure is illustrated. The exemplary structure may include many node areas for forming electrical nodes of a field effect transistor. For example, the exemplary structure may include a drain area 100 for forming a drain region therein, a source area 200 for forming one or more source regions therein, and a body contact area 300 for forming one or more body contact regions therein. In one embodiment, the drain area 100, the at least one source area 200, and the at least one body contact area 300 may have a nested configuration in which the drain area 100 may be encircled by a source area 200, and the source area may be encircled by the body contact area 300. Alternatively, the drain area 100, the at least one source area 200, and the at least one body contact area 300 may have a non-nested configuration such as a linear configuration in which a first body contact area 300, a first source area 200, a drain area 100, a second source area 200, and a second body contact area 300 may be arranged in order along a horizontal direction. The lateral dimensions of the drain area 100, the at least one source area 200, and the at least one body contact area 300 may be selected based on the operational voltage and the current rating of a high voltage field effect transistor to be subsequently formed. For example, each of the drain area 100, the at least one source area 200, and the at least one body contact area 300 may have a rectangular outer periphery, and a width of the drain area 100 as measured between a parallel pair of edges of a respective outer periphery may be in a range from 1 micron to 100 microns, such as from 3 microns to 30 microns, although lesser and greater widths may also be used. The width of each of the at least one source area 200 and the at least one body contact area 300, as measured between a neighboring pair of edges of a periphery or between a neighboring pair of an edge of an inner periphery and an edge of an outer periphery, may be in a range from 1 micron to 100 microns, such as from 3 microns to 30 microns, although lesser and greater widths may also be used.

The exemplary structure may include a semiconductor-on-insulator (SOI) substrate 8. The SOI substrate may include a vertical stack of a substrate semiconductor layer 2, a buried insulating layer 4, and a semiconductor material layer 6. The substrate semiconductor layer 2 has a high electrical resistivity to reduce capacitive coupling between the substrate semiconductor layer 2 and the semiconductor material layer 6. The range of the direct-current resistivity of the semiconductor material (such as single crystalline silicon) in the substrate semiconductor layer 2 may be in the range from $3.0 \times 10^2$ Ω-cm to $3.0 \times 10^4$ Ω-cm, such as a range from $1.0 \times 10^3$ Ω-cm to $1.0 \times 10^4$ Ω-cm. A direct-current resistivity refers to the resistivity of the material in the under a direct current (DC) electrical bias condition. Such high DC resistivity for the substrate semiconductor layer 2 may be provided by using a single crystalline semiconductor material having a very low level of electrical doping. For example, the substrate semiconductor layer 2 may include single crystalline silicon having an atomic concentration of electrical dopants (which may be p-type dopants or n-type dopants) in a range from $3.0 \times 10^{11}/cm^3$ to $3.0 \times 10^{13}/cm^3$, such as a range from $1.0 \times 10^{12}/cm^3$ to $1.0 \times 10^{13}/cm^3$. The electrical dopants may be p-type electrical dopants such as boron or n-type electrical dopants such as phosphorus, arsenic, and/or antimony.

The thickness of the substrate semiconductor layer 2 may be selected to provide sufficient mechanical support to layers and structures to be subsequently formed thereupon. In one embodiment, the thickness of the substrate semiconductor layer 2 may be in a range from 100 microns to 2 mm. In one embodiment, the entirety of the substrate semiconductor layer 2 may be single crystalline. In one embodiment, the substrate semiconductor layer 2 may include, and/or may consist of, single crystalline silicon. In one embodiment, the substrate semiconductor layer 2 may include, and/or may consist of, a commercially available silicon substrate having a diameter such as 200 mm, 300 mm, or 450 mm, and having DC resistivity in a range from $3.0 \times 10^2$ Ω-cm to $3.0 \times 10^4$ Ω-cm, The buried insulating layer 4 includes an insulating material such as silicon oxide. In one embodiment, the buried insulating layer 4 may include high quality silicon oxide formed by thermal oxidation of silicon. The thickness of the buried insulating layer 4 may be in a range from 100 nm to 300 nm, although lesser and greater thicknesses may also be used.

The semiconductor material layer 6 may include a single crystalline semiconductor material such as single crystalline silicon. The thickness of the semiconductor material layer 6 may be in a range from 600 nm to 2,000 nm, such as from 800 nm to 1,500 nm, although lesser and greater thicknesses may also be used. The semiconductor material layer 6 may include electrical dopants of a first conductivity type, which may be p-type dopants or n-type dopants. The atomic concentration of the electrical dopants of the first conductivity type in the semiconductor material layer 6 may be in a range from $1\times10^{14}/cm^3$ to $3\times10^{17}/cm^3$, such as from $3\times10^{14}/cm^3$ to $1\times10^{17}/cm^3$, although lesser and greater average dopant concentrations may also be used.

Shallow trenches 11 may be formed in an upper portion of the semiconductor material layer 6. For example, a first hard mask layer 9 may be formed over the top surface of the semiconductor material layer 6. The first hard mask layer 9 may include a dielectric material such as silicon nitride. A photoresist layer (not shown) may be applied over the first hard mask layer 9, and may be lithographically patterned. The pattern in the photoresist layer may be transferred into the first hard mask layer 9 using an anisotropic etch process such as a reactive ion etch process. The photoresist layer may be removed, for example, by ashing after patterning the first hard mask layer 9. Alternatively, the photoresist layer may be removed after formation of the shallow trenches 11.

The openings in the first hard mask layer 9 may include a first opening that is formed within the drain area 100, at least one second opening that is formed within the at least one source area 200, and at least one third opening that is formed within the at least one body contact area 300. An anisotropic etch process may be performed to transfer the pattern in the first hard mask layer 9 through an upper portion of the semiconductor material layer 6. Shallow trenches 11 may be formed in cavities formed by removal of the semiconductor material from the semiconductor material layer 6. The shallow trenches 11 may laterally surround unetched portions of the semiconductor material layer 6 that are proximal to the topmost surface of the semiconductor material layer 6. Such unetched upper portions of the semiconductor material layer 6 may be located within the drain area 100, the at least one source area 200, and the at least one body contact area 300, and may be subsequently used to form a drain region, at least one source region, and at least one body contact region. The depth of the shallow trenches 11 may be in a range from 150 nm to 800 nm, such as from 200 nm to 600 nm, and/or from 250 nm to 500 nm, although lesser and greater depths may also be used.

Figure 2:
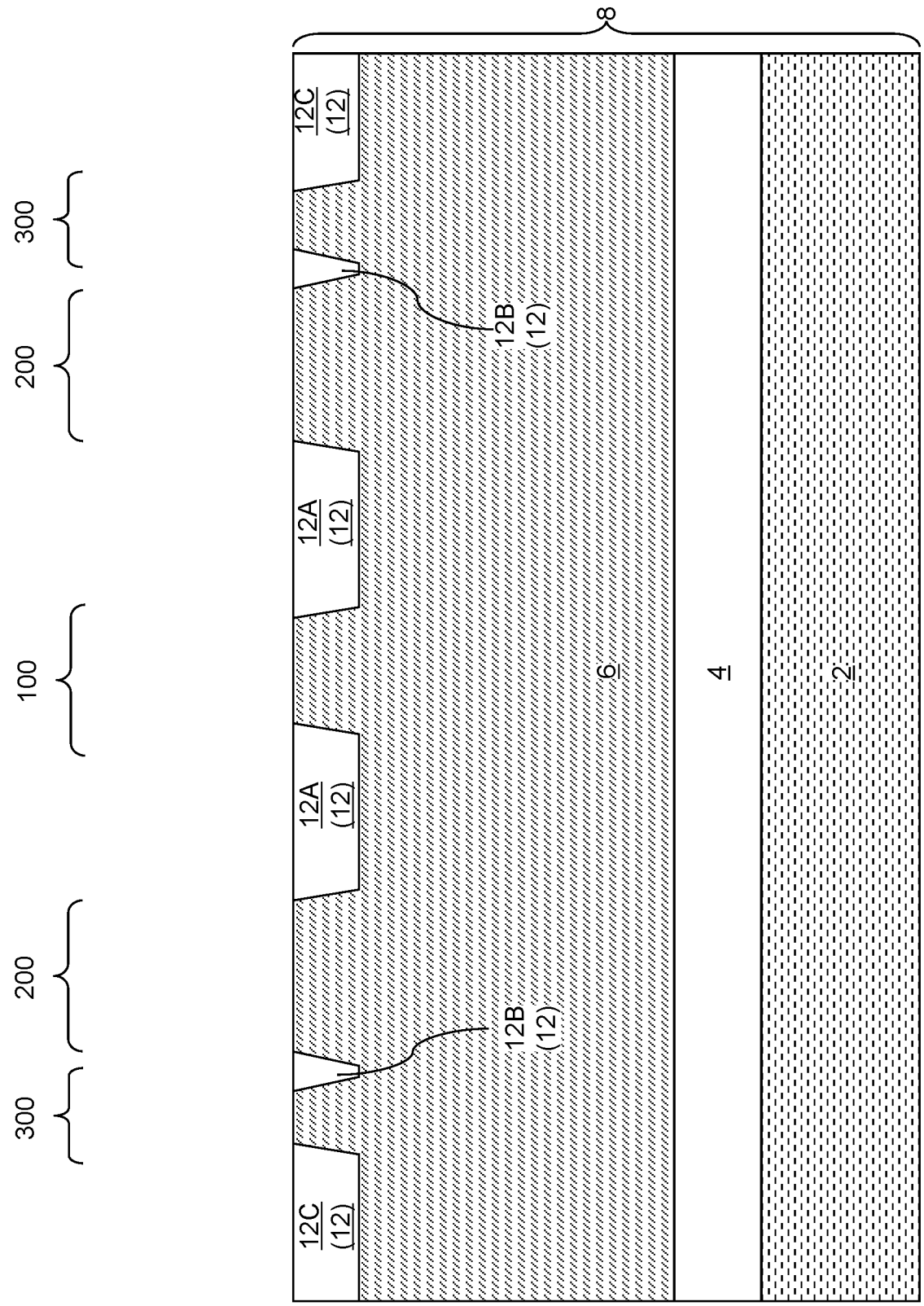
FIG. 2 is a vertical cross-sectional view of an exemplary structure after formation of shallow trench isolation structures according to an embodiment of the present disclosure.

Referring to FIG. 2, a dielectric fill material such as silicon oxide may be deposited in the shallow trenches 11 by a conformal deposition process such as a chemical vapor deposition (CVD) process. Excess portions of the dielectric fill material may be removed from above the horizontal plane including the top surface of the first hard mask layer 9 by performing a planarization process, which may include a chemical mechanical polishing (CMP) process and/or a recess etch process. Remaining portions of the dielectric fill material may be subsequently recessed, for example, by performing a wet etch process that recesses top surfaces of the remaining portions of the dielectric material approximately down to the horizontal plane including the topmost surface of the semiconductor material layer 6. A shallow trench isolation structure 12 may be formed in the shallow trenches. The shallow trench isolation structure 12 includes remaining portions of the dielectric fill material, which may include silicon oxide. The top surface of the shallow trench isolation structure 12 may be located above, below, or at the horizontal plane including the topmost surface of the semiconductor material layer 6. The first hard mask layer 9 may be subsequently removed selective to the materials of the semiconductor material layer 6 and the shallow trench isolation structure 12, for example, using a wet etch process. For example, if the first hard mask layer 9 comprises silicon nitride, a wet etch process using hot phosphoric acid may be used to remove the first hard mask layer 9.

The shallow trench isolation structure 12 may be a single continuous structure including multiple shallow trench isolation portions (12A, 12B, 12C) that may be interconnected to one another, or may include multiple shallow trench isolation portions (12A, 12B, 12C) that may be disjoined from one another depending on the configuration of the drain region, the at least one source region, and the at least one body contact region to be subsequently formed. In one embodiment, a drain area 100 may be laterally surrounded by a first shallow trench isolation portion 12A. The first shallow trench isolation portion 12A may be laterally surrounded by a source area 200. The source area 200 may be laterally surrounded by a second shallow trench isolation portion 12B. The second shallow trench isolation portion 12B may be laterally surrounded by a body contact area 300. The body contact area 300 may be laterally surrounded by a third shallow trench isolation portion 12C. Alternatively, a drain area 100, at least one source area 200, and at least one body contact area 300 may be arranged in a non-nested configuration, and at least two of the first shallow trench isolation portion 12A, the second shallow trench isolation portion 12B, and the third shallow trench isolation portion 12C may be adjoined to each other or among one another.

Figure 3:
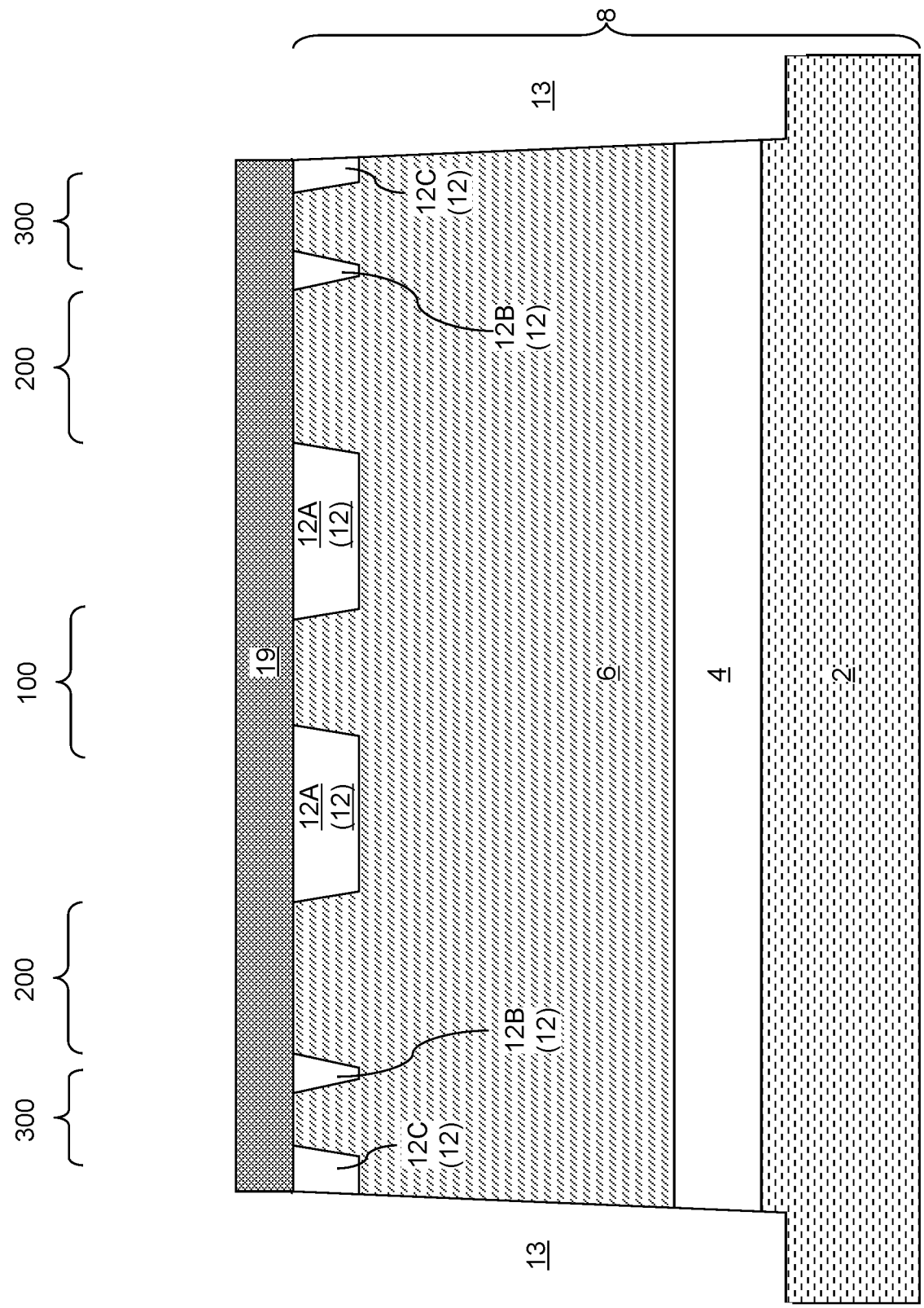
FIG. 3 is a vertical cross-sectional view of an exemplary structure after formation of deep trenches according to an embodiment of the present disclosure.

Referring to FIG. 3, deep trenches 13 may be formed. For example, a second hard mask layer 19 may be formed over the top surface of the semiconductor material layer 6 and the shallow trench isolation structure 12. The second hard mask layer 19 includes a dielectric material such as silicon nitride. A photoresist layer (not shown) may be applied over the second hard mask layer 19, and may be lithographically patterned to form at least one opening within the area of the third shallow trench isolation portion 12C. The pattern in the photoresist layer may be transferred into the second hard mask layer 19 using an anisotropic etch process such as a reactive ion etch process. The photoresist layer may be removed, for example, by ashing after patterning the second hard mask layer 19. Alternatively, the photoresist layer may be removed after formation of the deep trenches 13.

An anisotropic etch process may be performed to transfer the pattern in the second hard mask layer 19 through the third shallow trench isolation portion 12C, an underlying portion of the semiconductor material layer 6, and an underlying portion of the buried insulating layer 4, and into an upper portion of the substrate semiconductor layer 2. At least one deep trench 13 may be formed in at least one cavity formed by removal of the materials of the third shallow trench isolation portion 12C, the semiconductor material layer 6, the buried insulating layer 4, and the upper portion of the substrate semiconductor layer 2. The depth of each deep trench 13 may be in a range from 700 nm to 2,500 nm, such as from 1,000 nm to 2,000 nm, although lesser and greater depths may also be used. An upper region of each deep trench 13 may be laterally surrounded by a remaining portion of a third shallow trench isolation portion 12C.

Figure 4:
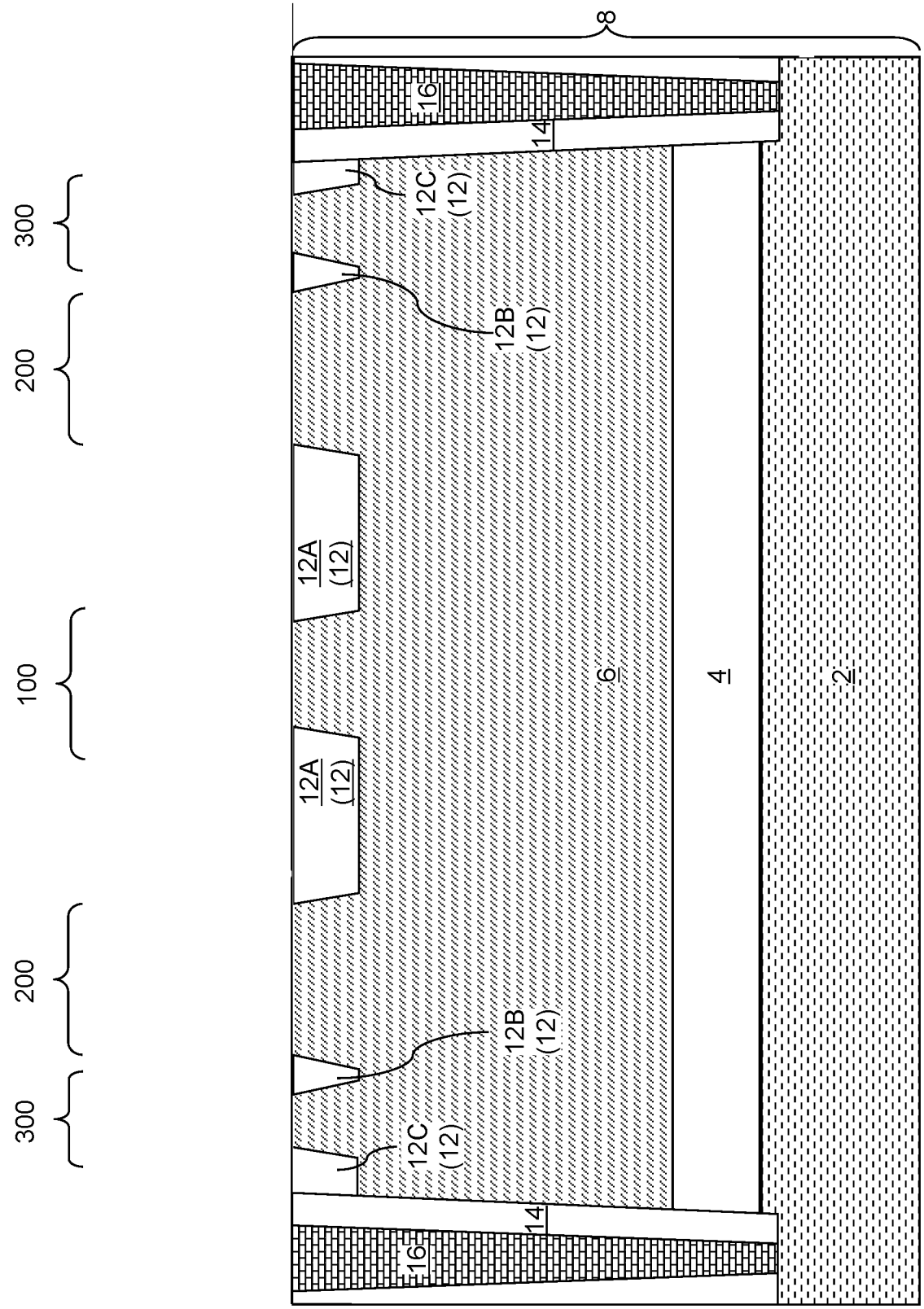
FIG. 4 is a vertical cross-sectional view of an exemplary structure after formation of deep trench isolation structures and substrate contact via structures according to an embodiment of the present disclosure.

Referring to FIG. 4, a dielectric material layer such as a silicon oxide layer may be conformally deposited in each deep trench 13 and over the second hard mask layer 19. For example, a chemical vapor deposition process may be used to deposit the dielectric material layer. The thickness of the dielectric material layer may be in a range from 30 nm to 300 nm, such as from 60 nm to 150 nm, although lesser and greater thicknesses may also be used. In one embodiment, the thickness of the dielectric material layer may be less than one half of the width of a bottom surface of each deep trench 13. An anisotropic etch process may be performed to remove horizontally-extending portions of the dielectric material layer. Each remaining vertically-extending portion of the dielectric material layer constitutes a deep trench isolation structure 14, which is also referred to as a deep trench spacer or a dielectric spacer.

At least one conductive material such as heavily doped amorphous silicon or heavily doped polysilicon may be deposited in the remaining volume of each deep trench 13 by a conformal deposition process such as a chemical vapor deposition process. The thickness of the deposited conductive material layer may be selected such that the entire volume of each deep trench 13 is filled with a combination of a deep trench isolation structure 14 and the at least one conductive material. Excess portions of the at least one conductive material may be removed from above the horizontal plane including the top surface of the semiconductor material layer 6, for example, by performing a recess etch process. The recess etch process may use a wet etch process or a reactive ion etch process. Each remaining portion of the at least one conductive material constitutes a substrate contact via structure 16, which provides an electrically conductive path between the substrate semiconductor layer 2 and metal interconnect structures to be subsequently formed. The substrate contact via structure 16 may be used to electrically bias the substrate semiconductor layer 2 during operation of a field effect transistor to be subsequently formed. The second hard mask layer 19 may be subsequently removed, for example, by a wet etch process. For example, if the second hard mask layer 19 comprises silicon oxide, a wet etch process using hot phosphoric acid may be used to remove the second hard mask layer 19.

In one embodiment, each deep trench isolation structure 14 comprises a dielectric material, and vertically extends at least from a shallow trench isolation structure (such as the third shallow trench isolation portion 12C) to the substrate semiconductor layer 2. A substrate contact via structure 16 vertically extends through the deep trench isolation structure 14 and contacting a semiconductor material within the substrate semiconductor layer 2.

Figure 5:
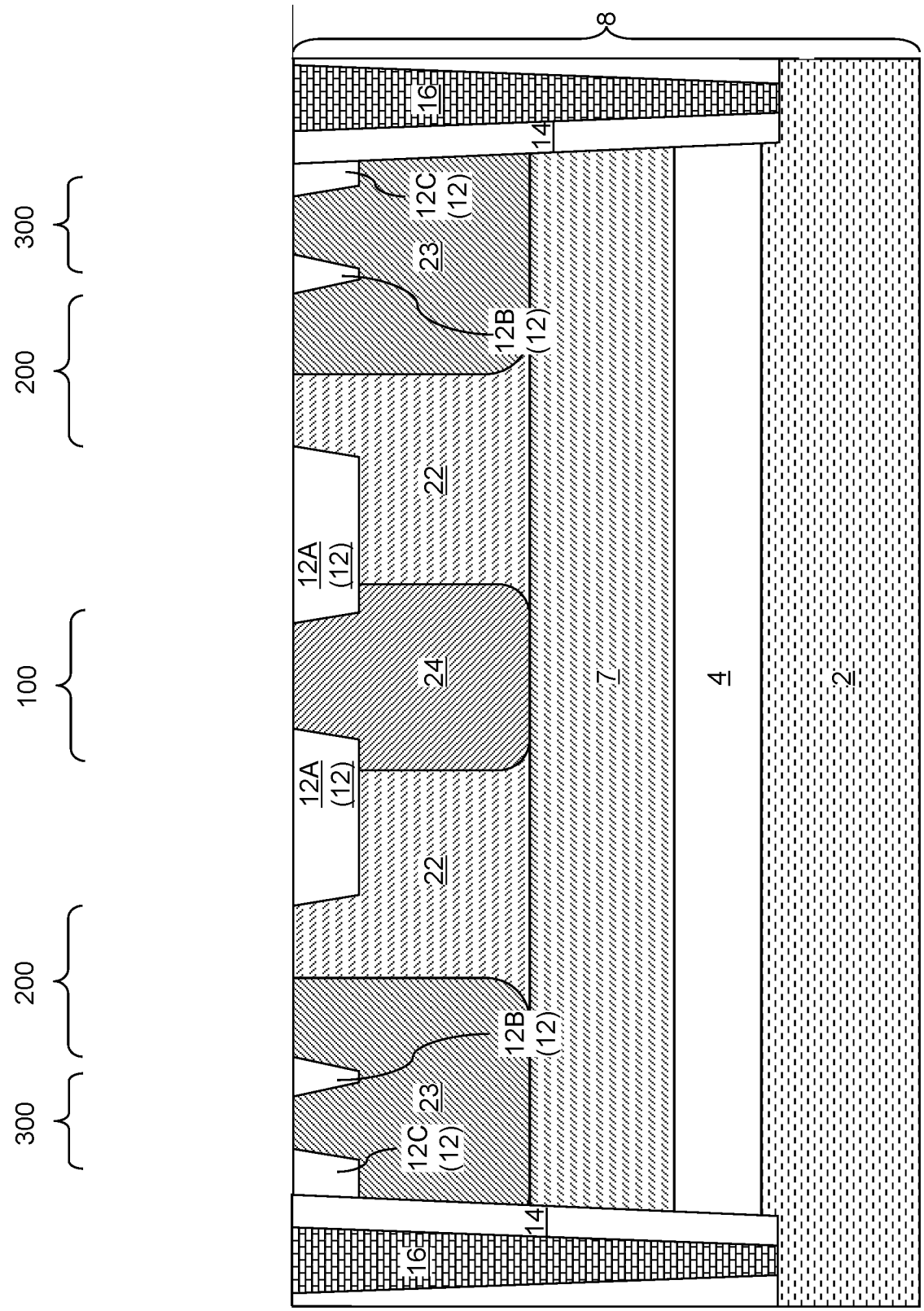
FIG. 5 is a vertical cross-sectional view of the exemplary structure after formation of various doped wells according to an embodiment of the present disclosure.

Referring to FIG. 5, various doped wells (22, 23, 24) may be formed by implanting electrical dopants into an upper portion of the semiconductor material layer 6. In an illustrative example, a second-conductivity-type layer may be formed in an upper portion of the semiconductor material layer 6 by implanting dopants of a second conductivity type into the upper portion of the semiconductor material layer 6. The second conductivity type is the opposite of the first conductivity type. For example, if the first conductivity type is p-type, the second conductivity type is n-type and vice versa. The implantation depth of the dopants of the second conductivity type is less than the thickness of the semiconductor material layer 6. The dose of the dopants of the second conductivity type may be selected such that the implanted portion of the semiconductor material layer 6 includes the dopants of the second conductivity type at a higher atomic concentration than dopants of the first conductivity type (as provided within the material of the semiconductor material layer 6 at the processing steps of FIG. 1).

The unimplanted portion of the semiconductor material layer 6 is herein referred to as a buried doped semiconductor layer 7. The buried doped semiconductor layer 7 may have a thickness in a range from 200 nm to 1,400 nm, such as from 300 nm to 1,000 nm, although lesser and greater thicknesses may also be used. The buried doped semiconductor layer 7 may include electrical dopants of the first conductivity type at an atomic concentration in a range from $1\times10^{14}/cm^3$ to $3\times10^{17}/cm^3$, such as from $3\times10^{14}/cm^3$ to $1\times10^{17}/cm^3$, although lesser and greater average dopant concentrations may also be used.

The implanted portion of the semiconductor material layer 6 that is formed above the buried doped semiconductor layer 7 by implantation of dopants of the second conductivity type includes dopants of the second conductivity type at a higher atomic concentration than dopants of the first conductivity type. Thus, the implanted portion of the semiconductor material layer 6 has a doping of the second conductivity type, and thus, constitutes the second-conductivity-type layer. The net dopant concentration (i.e., the atomic concentration of dopants of the second conductivity type less the atomic concentration of dopants of the first conductivity type) in the second-conductivity type layer may be in range from $1\times10^{14}/cm^3$ to $1\times10^{18}/cm^3$, such as from $3\times10^{14}/cm^3$ to $3\times10^{17}/cm^3$, although lesser and greater net dopant concentrations may also be used.

A first masked ion implantation process may be subsequently performed to implant dopants of the first conductivity type. For example, a first implantation mask (not shown) may be formed to cover the drain area 100, the first shallow trench isolation portion 12A, and portions of the second-conductivity-type layer that are proximal to the first shallow trench isolation portion 12A. The first implantation mask may be a patterned photoresist layer. The first implantation mask does not cover the body contact area 300, the second shallow trench isolation portion(s) 12B, the third shallow trench isolation portion(s) 12C, or portions of the second-conductivity-type layer that are proximal to the second shallow trench isolation portion 12B. Dopants of the first conductivity type may be implanted into unmasked portions of the second-conductivity-type layer such that implanted portions of the second-conductivity-type layer include more dopants of the first conductivity type than dopants of the second conductivity type. Each implanted portion of second-conductivity-type layer is converted into a doped semiconductor well having a doping of the first conductivity type, which is herein referred to as a source-side doped well 23. The net dopant concentration (i.e., the atomic concentration of dopants of the first conductivity type less the atomic concentration of dopants of the second conductivity type) in each source-side doped well 23 may be in range from $3\times10^{14}/cm^3$ to $3\times10^{18}/cm^3$, such as from $1\times10^{15}/cm^3$ to $1\times10^{18}/cm^3$, and/or from $3\times10^{15}/cm^3$ to $3\times10^{17}/cm^3$, although lesser and greater net dopant concentrations may also be used. The first implantation mask may be subsequently removed, for example, by ashing.

A second masked ion implantation process may be subsequently performed to implant dopants of the second conductivity type. For example, a second implantation mask (not shown) may be formed to cover all areas except the drain area 100 and the area of an adjacent portion of the first shallow trench isolation portion 12A. The second implantation mask may be a patterned photoresist layer. Dopants of the second conductivity type may be implanted into unmasked portions of the second-conductivity-type layer such that implanted portions of the second-conductivity-type layer include more second-conductivity-type dopants than unimplanted portions of the second-conductivity-type layer. Each implanted portion of second-conductivity-type layer forms a doped semiconductor well having a doping of second conductivity type, which is herein referred to as a drain-side doped well 24. The net dopant concentration (i.e., the atomic concentration of dopants of the second conductivity type less the atomic concentration of dopants of the first conductivity type) in the drain-side doped well 24 may be in range from $3\times10^{14}/cm^3$ to $3\times10^{18}/cm^3$, such as from $1\times10^{15}/cm^3$ to $1\times10^{18}/cm^3$, and/or from $3\times10^{15}/cm^3$ to $3\times10^{17}/cm^3$, although lesser and greater net dopant concentrations may also be used. The second implantation mask may be subsequently removed, for example, by ashing.

The remaining portion of the second-conductivity-type layer that is not implanted with any additional dopants during the first masked ion implantation process or the second masked ion implantation process is disposed between the drain-side doped well 24 and the at least one source-side doped well 23, and is herein referred to as an intermediate doped well 22. The intermediate doped well 22 has a net dopant concentration (i.e., the atomic concentration of dopants of the second conductivity type less the atomic concentration of dopants of the first conductivity type) in range from $1\times10^{14}/cm^3$ to $1\times10^{18}/cm^3$, such as from $3\times10^{14}/cm^3$ to $3\times10^{17}/cm^3$, although lesser and greater net dopant concentrations may also be used.

Figure 6A:
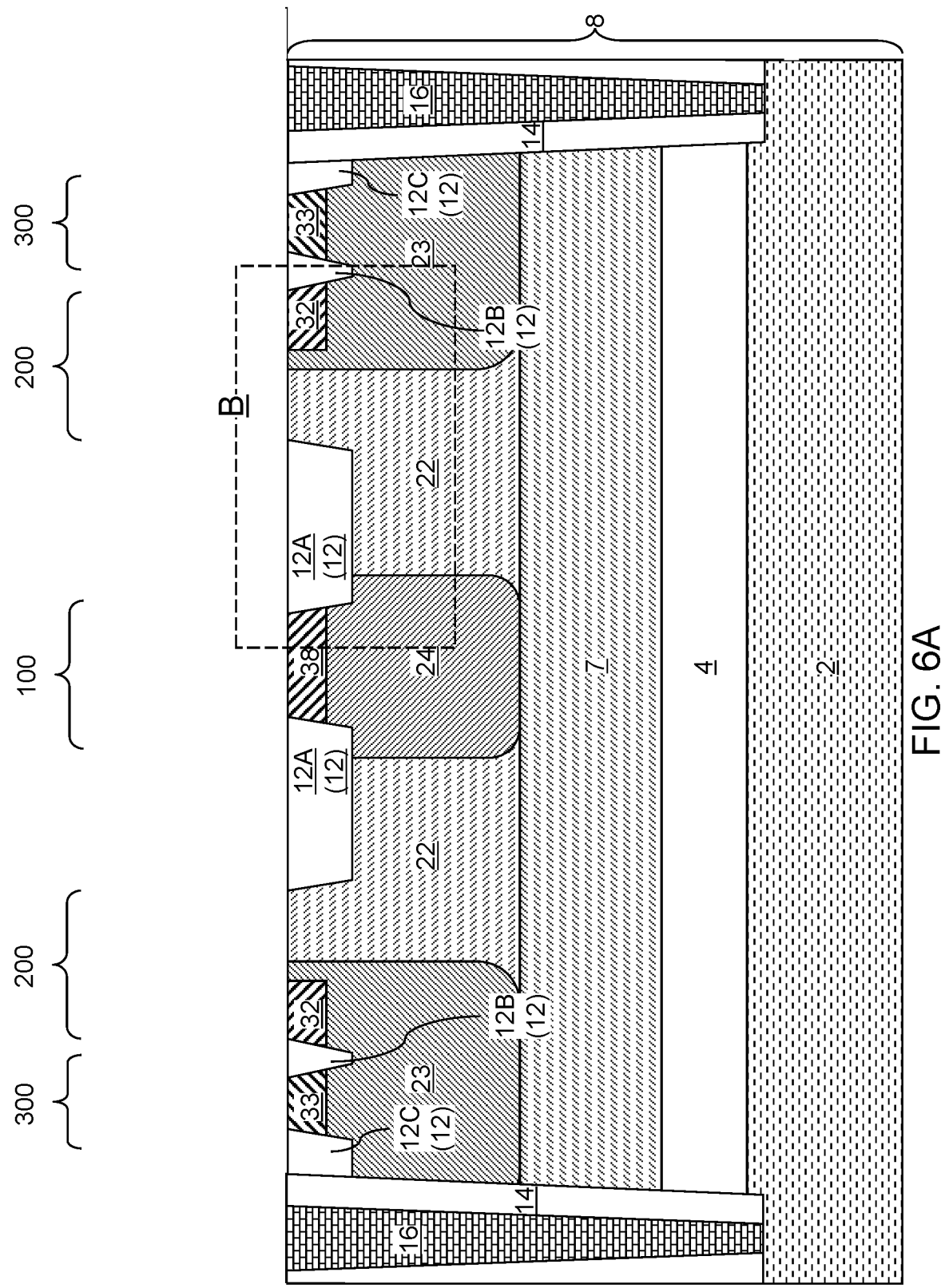
FIG. 6A is a vertical cross-sectional view of the exemplary structure after formation of a drain region, source regions, and body contact regions according to an embodiment of the present disclosure.
Figure 6B:
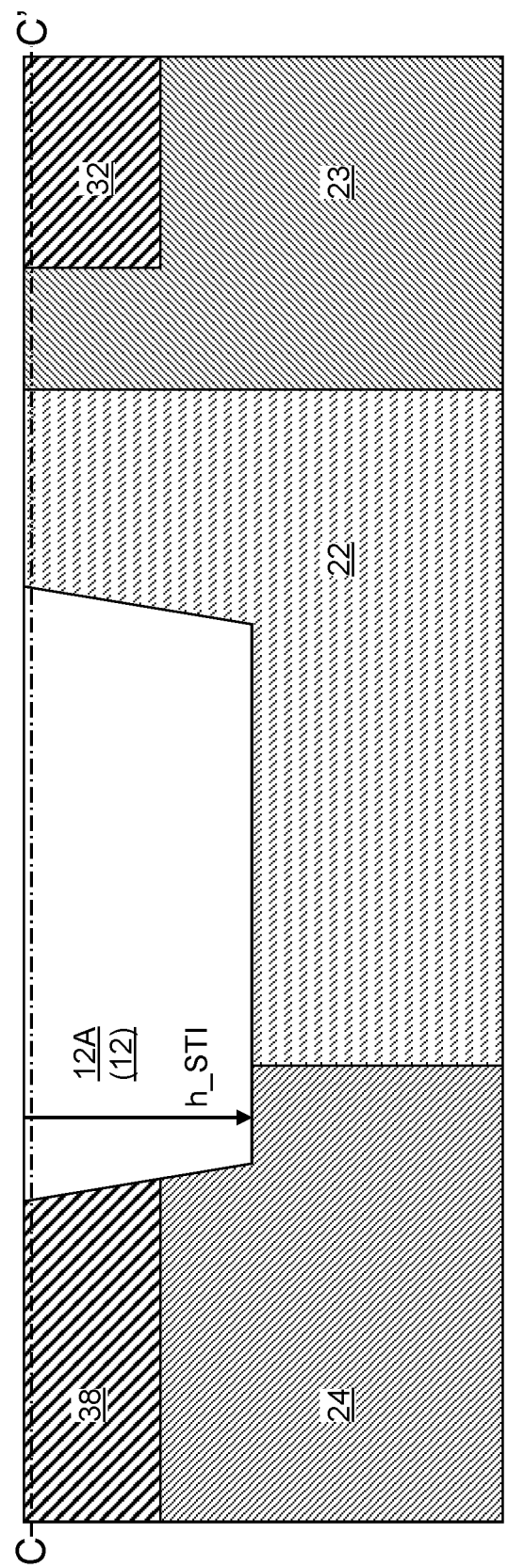
FIG. 6B is a magnified view of region B of FIG. 6A.

Referring to FIGS. 6A-6C, a third masked ion implantation process may be subsequently performed to implant dopants of the second conductivity type. For example, a third implantation mask (not shown) may be formed over the substrate 8, and may be patterned to form an opening within the drain area 100 and to form an opening within each source area 200. The third implantation mask may be a patterned photoresist layer. Dopants of the second conductivity type may be implanted into unmasked portions of the source-side doped well 23 (which has a doping of the first conductivity type) and into unmasked portions of the drain-side doped well (which has a doping of the second conductivity type). The implanted surface portion of the drain-side doped well 24 may be converted into a drain region 38. Each implanted surface portion of the source-side doped well 23 may be converted into a source region 32.

Each source region 32 and drain region 38 may have a doping of the second conductivity type. The net dopant concentration (i.e., the atomic concentration of dopants of the second conductivity type less the atomic concentration of dopants of the first conductivity type) in each source region 32 and the drain region 38 may be in range from $3\times10^{19}/cm^3$ to $1\times10^{20}/cm^3$, such as from $1\times10^{20}/cm^3$ to $1\times10^{21}/cm^3$, and/or from $2\times10^{20}/cm^3$ to $6\times10^{20}/cm^3$, although lesser and greater net dopant concentrations may also be used. The third implantation mask may be subsequently removed, for example, by ashing.

A fourth masked ion implantation process may be subsequently performed to implant dopants of the first conductivity type. For example, a fourth implantation mask (not shown) may be formed over the substrate 8, and may be patterned to form an opening within each body contact area 300. The fourth implantation mask may be a patterned photoresist layer. Dopants of the first conductivity type may be implanted into unmasked portions of the source-side doped well 23 (which has a doping of the first conductivity type). The implanted surface portion of the source-side doped well 23 may be converted into a body contact region 33.

Each body contact region 33 may have a doping of the first conductivity type. The net dopant concentration (i.e., the atomic concentration of dopants of the first conductivity type less the atomic concentration of dopants of the second conductivity type) in each body contact region 33 may be in range from $3\times10^{19}/cm^3$ to $1\times10^{20}/cm^3$, such as from $1\times10^{20}/cm^3$ to $1\times10^{21}/cm^3$, and/or from $2\times10^{20}/cm^3$ to $6\times10^{20}/cm^3$, although lesser and greater net dopant concentrations may also be used. The fourth implantation mask may be subsequently removed, for example, by ashing.

Generally, doped semiconductor portions (22, 23, 24, 7, 32, 33, 38) may be formed at the processing steps of FIGS. 5 and 6 within the semiconductor material layer 6 as initially provided. In one embodiment, the doped semiconductor portions (22, 23, 24, 7, 32, 33, 38) comprise a source-side doped well 23 having a doping of a first conductivity type, a source region 32 having a doping of a second conductivity type that is the opposite of the first conductivity type and embedded in the source-side doped well 23, and a drain region 38 having a doping of the second conductivity type and laterally spaced from the source region 32 by a first shallow trench isolation portion 12A that is a portion of the shallow trench isolation structure 12.

The collection of all doped semiconductor portions (22, 23, 24, 7, 32, 33, 38) overlying the buried insulating layer 4 constitutes a semiconductor material layer (22, 23, 24, 7, 32, 33, 38). In one embodiment, the semiconductor material layer (22, 23, 24, 7, 32, 33, 38) comprises an intermediate doped well 22 formed between the source-side doped well 23 and the drain region 38 and having a doping of the second conductivity type and contacting a first segment of a horizontal bottom surface of the shallow trench isolation structure 12, which may be a first segment of a horizontal bottom surface of the first shallow trench isolation portion 12A. In one embodiment, the semiconductor material layer (22, 23, 24, 7, 32, 33, 38) comprises a drain-side doped well 24 having a doping of the second conductivity type, contacting a bottom surface of the drain region 38, and contacting a sidewall of the intermediate doped well 22 and a second segment of the horizontal bottom surface of the shallow trench isolation structure 12, which may be a second segment of the horizontal bottom surface of the first shallow trench isolation portion 12A. The intermediate doped well 22 may contact a sidewall of the source-side doped well 23. The drain region may be laterally spaced from the source-side doped well 23 by the intermediate doped well 22. The buried doped semiconductor layer 7 may have a doping of the first conductivity type, and may contact a bottom surface of the source-side doped well 23 and a bottom surface of the intermediate doped well 22, and may contact a bottom surface of the drain-side doped well 24.

In one embodiment, the average atomic concentration of dopants of the second conductivity type in the drain-side doped well 24 may be greater than the average atomic concentration of dopants of the second conductivity type conductivity type in the intermediate doped well 22, and may be less than an average atomic concentration of dopants of the second conductivity type in the drain region 38.

In one embodiment, the first shallow trench isolation portion 12A (which is a portion of the shallow trench isolation structure 12) may overlie an interface between the intermediate doped well 22 and the drain-side doped well 24, and may be laterally offset from an interface between the intermediate doped well 22 and the source-side doped well 23. In one embodiment, the shallow trench isolation structure 12 may laterally surround each of the drain region 38 and the at least one source region 32. In one embodiment, the drain region 38 may be located within a first opening in the shallow trench isolation structure 12 and an entirety of all sidewalls of the drain region 38 may contact the shallow trench isolation structure 12. In one embodiment, each source region 32 may be located within a respective second opening in the shallow trench isolation structure 12, and a sidewall of each source region 32 contacts a source-side doped well 23 and another sidewall of each source region 32 may contact the shallow trench isolation structure 12. In one embodiment, each body contact region 33 may contact a top portion of a source-side doped well 23, and may have a doping of the first conductivity type. Each body contact region 33 may include dopants of the first conductivity type at a higher atomic concentration than the source-side doped well 23.

In one embodiment, the shallow trench isolation structure 12 may be embedded in an upper region of the semiconductor material portions (22, 23, 24, 7, 32, 33, 38), and may overlie a sidewall and a recessed horizontal surface of the intermediate doped well 22. The drain-side doped well 24 may contact a bottom surface of the drain region 38 and a sidewall of the intermediate doped well 22. A sidewall of the shallow trench isolation structure 12 contacts a sidewall of the drain region 38 and a sidewall of the drain-side doped well 24.

Figure 7A:
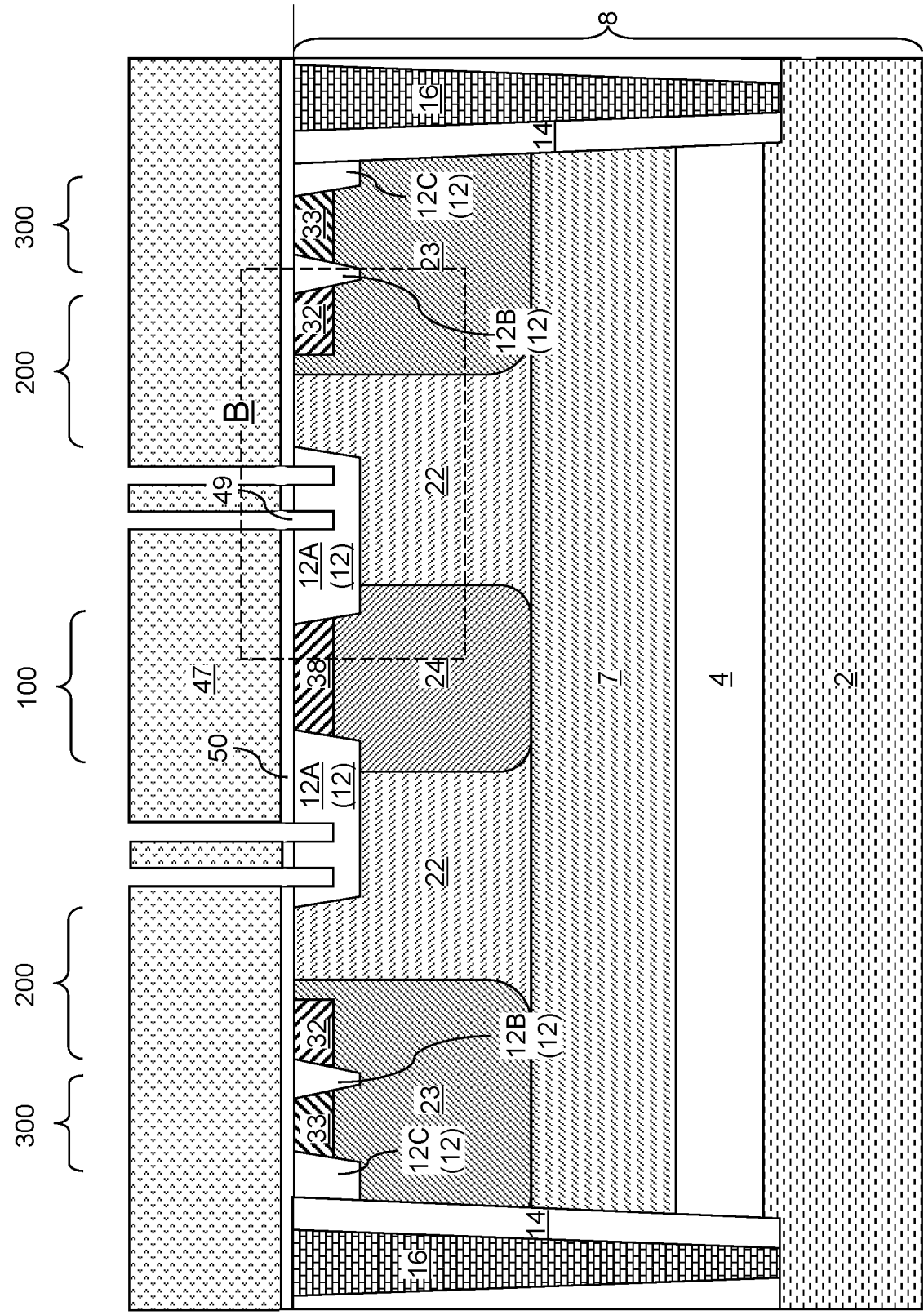
FIG. 7A is a vertical cross-sectional view of the exemplary structure after formation of a gate dielectric layer and at least one line trench through an upper portion of a shallow trench isolation structure according to an embodiment of the present disclosure.
Figure 7B:
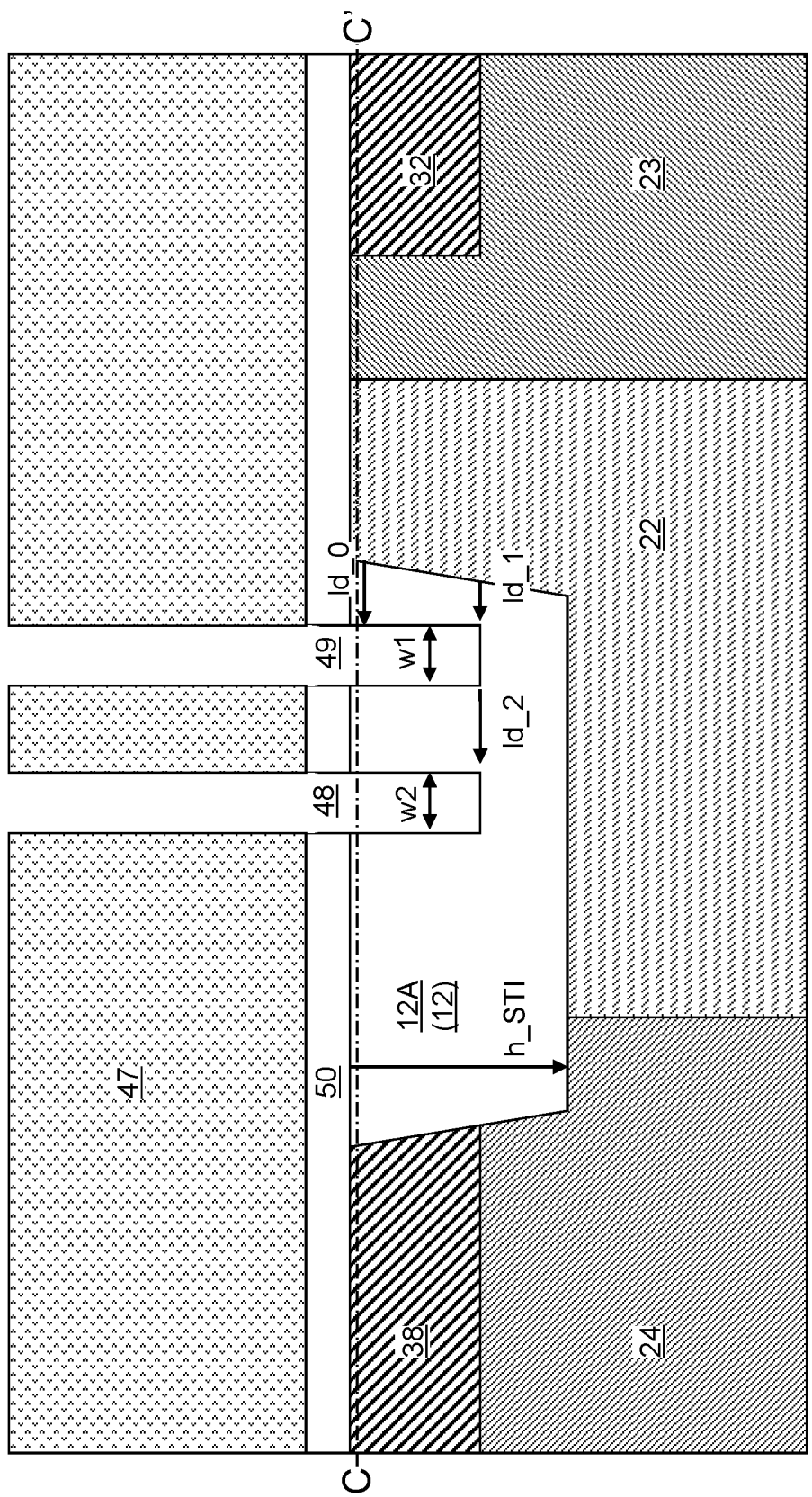
FIG. 7B is a magnified view of region B of FIG. 7A.
Figure 7C:
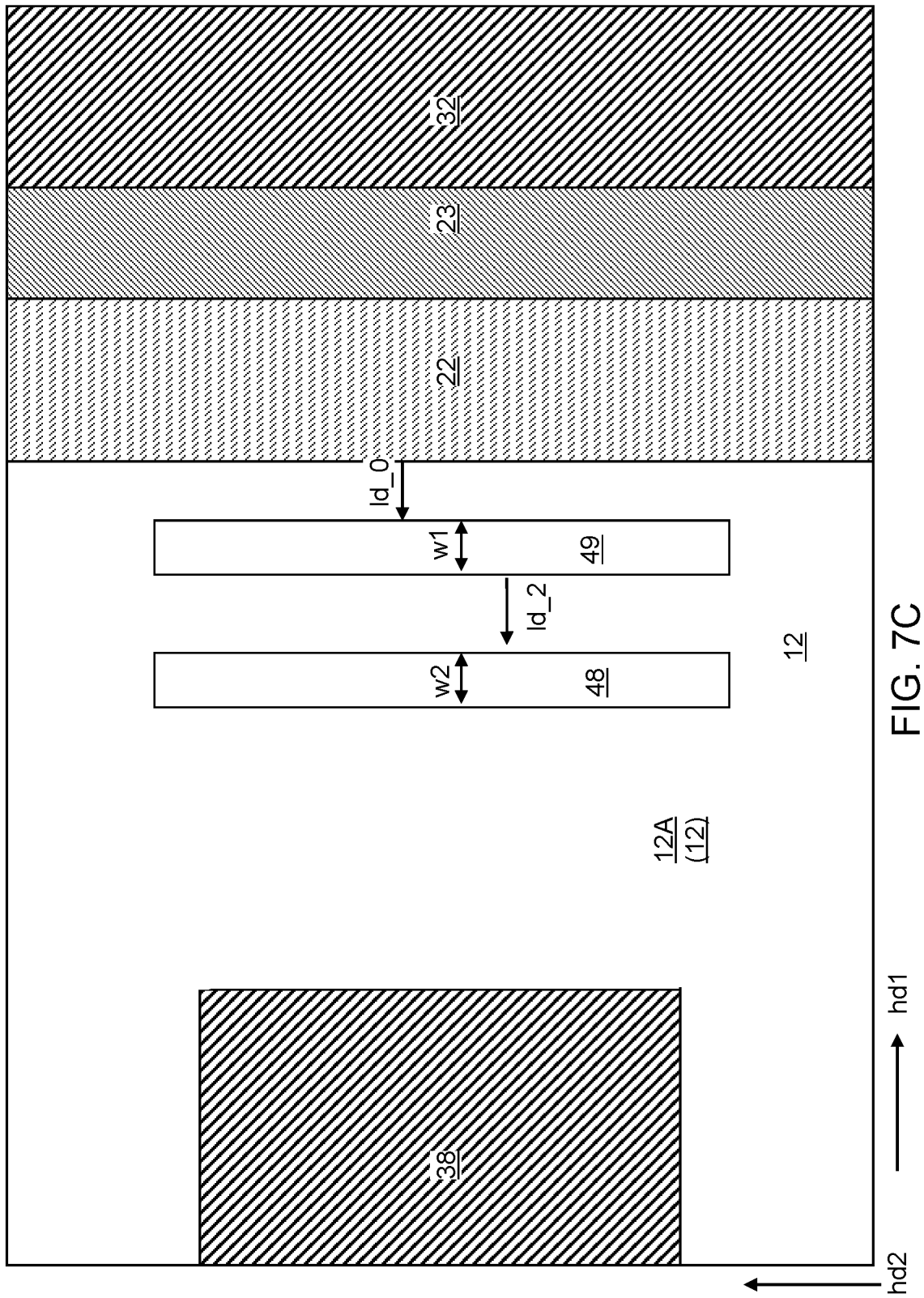
FIG. 7C is a top-down view of the portion of the exemplary structure illustrated in FIG. 7B.

Referring to FIGS. 7A-7C, a gate dielectric layer 50 may be formed over the semiconductor material portions (22, 23, 24, 7, 32, 33, 38) and the shallow trench isolation structure 12. The gate dielectric layer 50 may be formed by deposition of a gate dielectric material and/or by thermal conversion of a top surface portion of the semiconductor material portions (22, 23, 24, 7, 32, 38, 33). In embodiments in which the gate dielectric layer 50 is formed by deposition of a gate dielectric material (such as silicon oxide and/or at least one dielectric metal oxide material (e.g., aluminum oxide, hafnium oxide, lanthanum oxide, titanium oxide, tantalum oxide, etc.)), the gate dielectric layer 50 may include a continuous blanket material layer that continuously extends over the entire top surface of the substrate 8. In embodiments in which the gate dielectric layer 50 is formed by thermal conversion (such as thermal oxidation) of a top surface portion of the semiconductor material portions (22, 23, 24, 7, 32, 33, 38), the gate dielectric layer 50 may be formed only on the physically exposed semiconductor surfaces of the top surface portion of the semiconductor material portions (22, 23, 24, 7, 32, 33, 38), i.e., in areas that are not covered by the shallow trench isolation structure 12 and the deep trench isolation structure 14. Generally, any gate dielectric material known in the art may be used for the gate dielectric layer 50. The thickness of the gate dielectric layer 50 may depend on the operating voltage of the field effect transistor to be formed, and may be, for example, in a range from 6 nm to 100 nm, such as from 12 nm to 30 nm, although lesser and greater thicknesses may also be used.

According to an aspect of the present disclosure, a photoresist layer 47 may be formed on a top surface of the gate dielectric layer 50. The photoresist layer 47 may be lithographically patterned to form at least one line-shaped opening. The at least one line-shaped opening may be formed in a portion of the photoresist layer 47 that overlies a portions of the shallow trench isolation structure (such as the first shallow trench isolation portion 12A) located between a source region 32 and the drain region 38. In one embodiment, the source region 32 and the drain region 38 may be laterally spaced along a first horizontal direction hd1. A top edge of the first shallow trench isolation portion 12A contacting the gate dielectric layer 50 may laterally extend along a second horizontal direction hd2 that is perpendicular to the first horizontal direction hd1. The at least one line-shaped opening in the photoresist layer 47 may laterally extend along the second horizontal direction hd2.

An anisotropic etch process may be subsequently formed using the patterned photoresist layer 47 as an etch mask. Unmasked portions of the shallow trench isolation structure 12 may be anisotropically etched using the photoresist layer 47 as an etch mask layer. Etched volumes of the shallow trench isolation structure 12 comprises at least one line trench 49. The at least one line trench 49 may vertically extend into a portion of the shallow trench isolation structure 12 that is located between the source-side doped well 23 and the drain region 38. The entire area of the at least one line trench 49 may be located within the area of a portion of the shallow trench isolation structure 12 having an areal overlap with the intermediate doped well 22 in a plan view, i.e., a view along a vertical direction.

In one embodiment, the source region 32 and the drain region 38 may be laterally spaced apart along the first horizontal direction hd1, and each of the at least one line trench 49 may laterally extend through the first shallow trench isolation structure 12A along the second horizontal direction hd2 with a respective uniform width. In one embodiment, a vertical cross-sectional profile of each line trench 49 within a vertical plane that is perpendicular to the second horizontal direction hd2 may be invariant under translation along the second horizontal direction hd2. In one embodiment, each line trench 49 may have a respective uniform width along the first horizontal direction hd1 that is invariant under translation along the second horizontal direction hd2.

In one embodiment, the height h_STI of the shallow trench isolation structure 12 may be in a range from 150 nm to 800 nm, such as from 200 nm to 600 nm, and/or from 250 nm to 500 nm, although lesser and greater heights may also be used. The vertical distance between the bottom surface of the at least one line trench 49 and a bottom surface of an underlying portion of the shallow trench isolation structure 12 may be in a range from 20% to 60% of the height h_STI of the shallow trench isolation structure. For example, the vertical distance between the bottom surface of the at least one line trench 49 and a bottom surface of an underlying portion of the shallow trench isolation structure 12 may be in a range from 30 nm to 480 nm, such as from 60 nm to 360 nm, and/or from 120 nm to 300 nm, although lesser and greater vertical distances may also be used. The lower limit on the vertical distance between the bottom surface of the at least one line trench 49 and a bottom surface of an underlying portion of the shallow trench isolation structure 12 is determined by the requirement that the shallow trench isolation structure 12 does not electrically break down between at least one downward-protruding portion of a gate electrode to be subsequently formed and the recessed horizontal surface of the intermediate doped well 22 that underlie the at least one line trench 49. The upper limit on the vertical distance between the bottom surface of the at least one line trench 49 and a bottom surface of an underlying portion of the shallow trench isolation structure 12 is imposed by the requirement that the at least one downward-protruding portion to be subsequently formed in the at least one line trench 49 effectively alters electrical field thereabout during operation of the high voltage field effect transistor.

In one embodiment, the at least one line trench 49 overlies a first segment of a bottom surface of the first shallow trench isolation portion 12A that contacts the intermediate doped well 22. A first sidewall of the first shallow trench isolation portion 12A extends from the first segment of the bottom surface of the first shallow trench isolation portion 12A to a bottom surface of the gate dielectric layer 50. The gate dielectric layer 50 contacts an upper edge of an interface between the source-side doped well 23 and the intermediate doped well 22. In one embodiment, the gate dielectric layer 50 may continuously extend from an upper edge of the first shallow trench isolation portion 12A that contacts the gate dielectric layer 50 and the intermediate doped well 22 to a top edge of an interface between the source region 32 and another portion of the shallow trench isolation structure 12 such as a second shallow trench isolation portion 12B.

In one embodiment, a minimum lateral distance between the at least one line trench and a top edge of an interface between the intermediate doped well 22 and the shallow trench isolation structure 12 (i.e., the first sidewall of the first shallow trench isolation portion 12A) that contacts the gate dielectric layer 50 may be less than the lateral distance between the at least one line trench 49 and the drain region 38. This minimum distance is herein referred to as a reference lateral distance ld_0.

In one embodiment, the at least one line trench 49 comprises a plurality of line trenches 49. Each of the plurality of line trenches 49 has a respective width (w1, w2) in a range from 100 nm to 300 nm. The lower limit for the width (w1, w2) of each line trench 49 is determined by the need to minimize the effect of electrical field concentration at sharp corners of conductive structures such as corners of a narrow protruding portion of a gate electrode. The upper limit for the width (w1, w2) of each line trench 49 is determined by the need to fit in all electrodes to be subsequently formed within the line trenches 49 within the region of the shallow trench isolation structure that overlie the intermediate doped well 22. For example, a first line trench 49 and a second line trench 48 (and optionally a third line trench and/or a fourth line trench, etc.) that are laterally spaced apart along the first horizontal direction hd1 may be provided. The first line trench 49 may have a first width w1, and the second line trench 48 may have a second width w2. The nearest neighbor spacing between the plurality of line trenches 49 may be in a range from 100 nm to 300 nm. The lower limit for the nearest neighbor spacing among the line trenches 49 is determined by the need to minimize the effect of electrical field concentration at sharp corners of conductive structures such as corners of two proximate protruding portions of a gate electrode. The upper limit for the nearest neighbor spacing among the line trenches 49 is determined by the need to fit in all electrodes to be subsequently formed within the line trenches 49 within the region of the shallow trench isolation structure that overlie the intermediate doped well 22. A lateral distance between the plurality of line trenches 49 and a most proximal top edge of the first shallow trench isolation portion 12A may be in a range from 100 nm to 300 nm. The lower limit on the lateral distance between the plurality of line trenches 49 and a most proximal top edge of the first shallow trench isolation portion 12A is determined by the need to avoid dielectric breakdown of the first shallow trench isolation portion 12A during operation of the high voltage field effect transistor. The upper limit on the lateral distance between the plurality of line trenches 49 and a most proximal top edge of the first shallow trench isolation portion 12A is determined by the need to for the portion of a gate electrode to be subsequently formed in the plurality of line trenches 49 to effectively function to alter the contours of the electrical field during operation to suppress hot carriers and charge injection. For example, the first line trench 49 may be laterally spaced from the most proximal top edge of the first shallow trench isolation portion 12A by a reference lateral distance ld_0 that is in a range from 100 nm to 300 nm. An edge of a bottom surface of first line trench 49 may be laterally spaced from a tapered first sidewall of the first shallow trench isolation portion 12A by a first lateral distance ld_1 (as shown in FIG. 8B), which is less than the reference lateral distance ld_0 and may be in a range from 50 nm to 150 nm. The second line trench 48 may be laterally spaced from the first line trench 49 by a second lateral distance ld_2, which may be in a range from 100 nm to 300 nm.

Figure 8A:
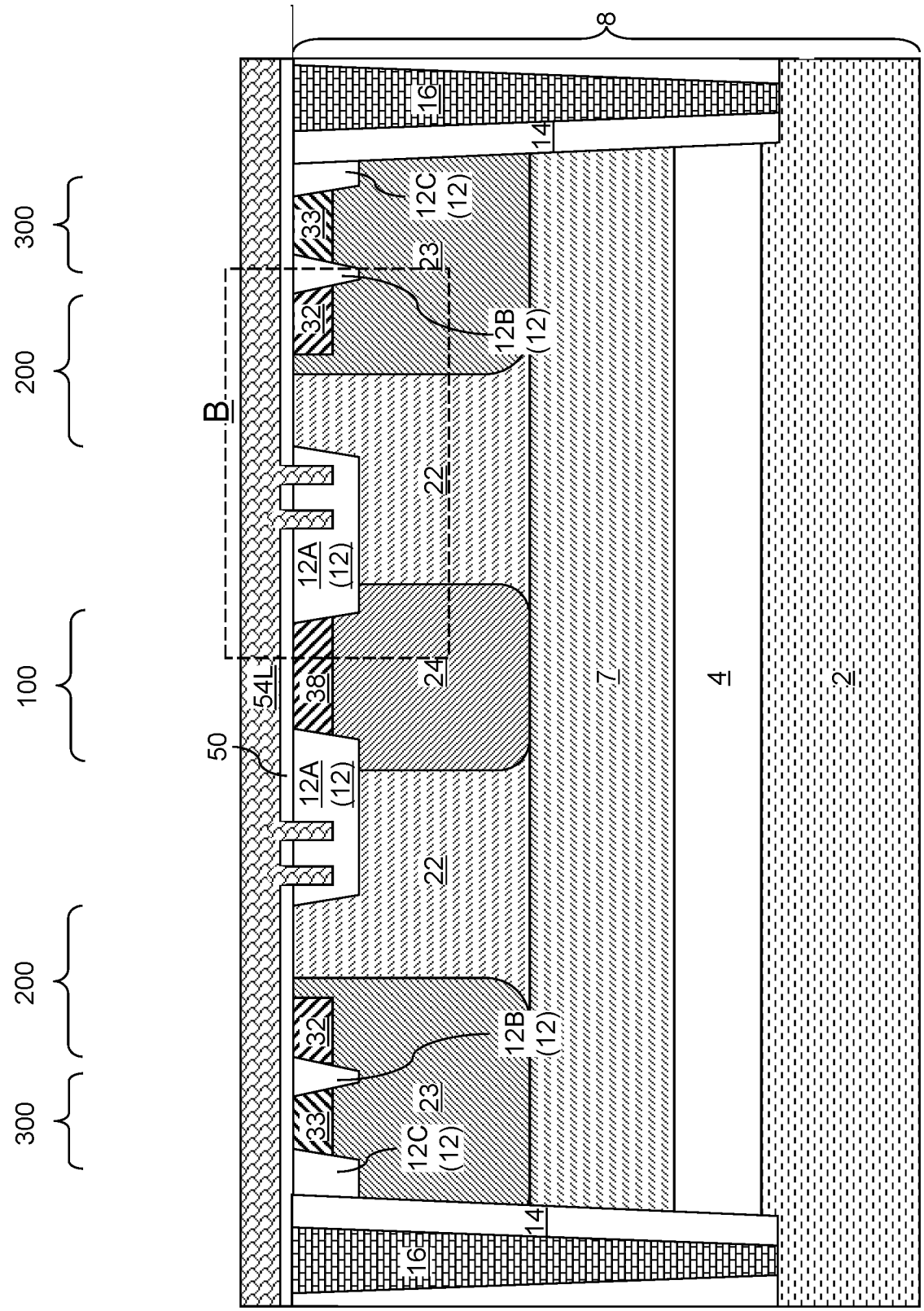
FIG. 8A is a vertical cross-sectional view of the exemplary structure after formation of a gate electrode layer according to an embodiment of the present disclosure.
Figure 8B:
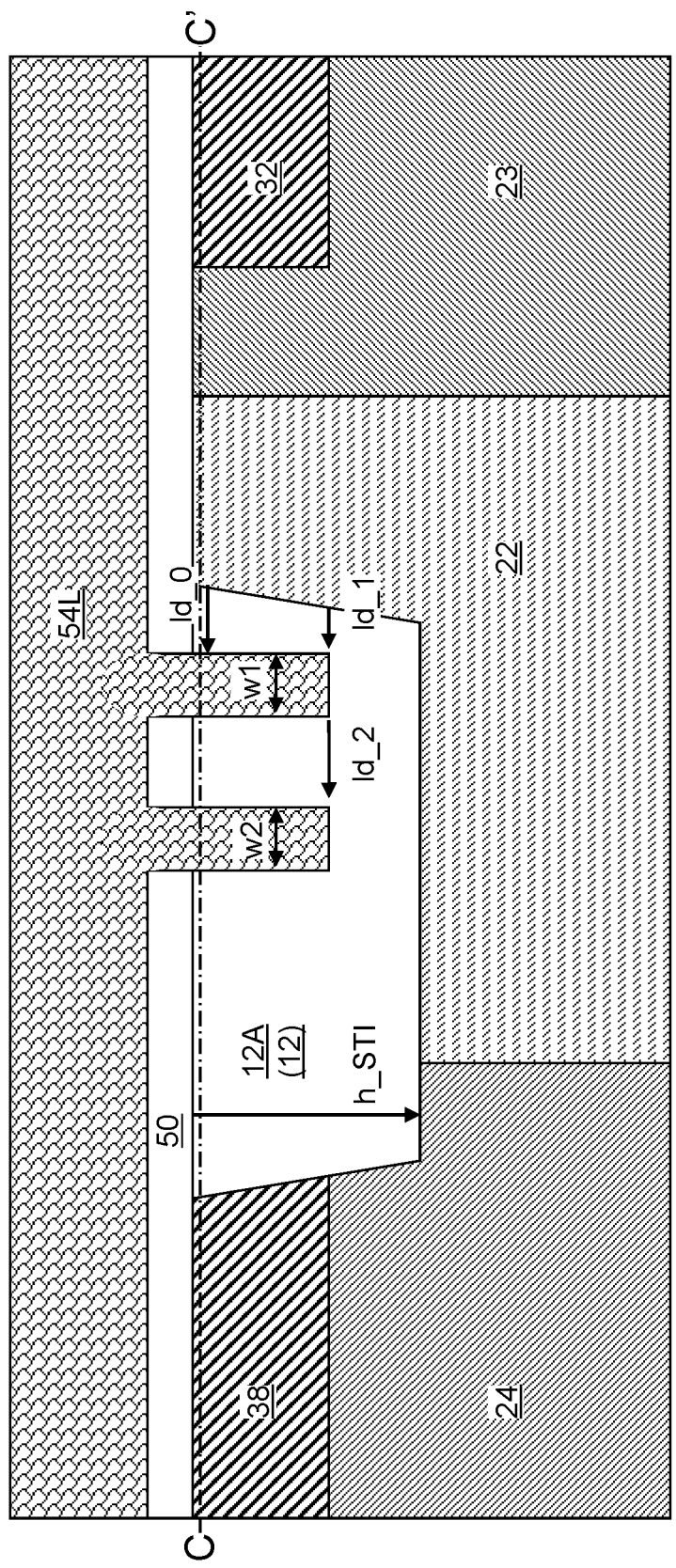
FIG. 8B is a magnified view of region B of FIG. 8A.
Figure 8C:
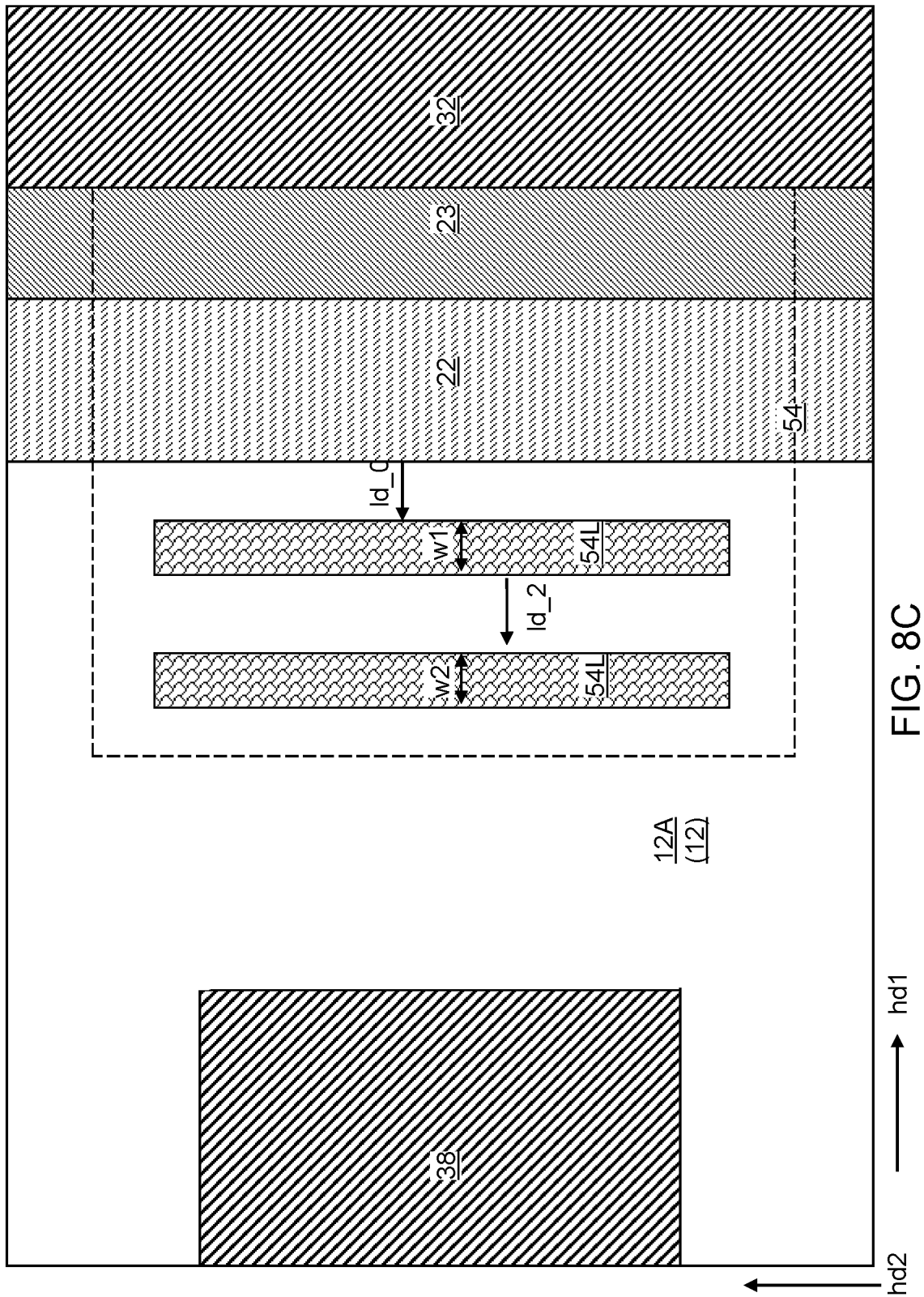
FIG. 8C is a horizontal cross-sectional view of the exemplary structure along the horizontal plane C-C' of FIG. 8B.

Referring to FIGS. 8A-8C, a gate electrode layer 54L may be deposited over the gate dielectric layer 50 and in each line trench 49 by a conformal deposition process such as a chemical vapor deposition process. The gate electrode layer 54L includes a conductive material such as heavily-doped polysilicon and/or at least one metallic material, such as a combination of a metallic barrier liner including a conductive metallic nitride material and a metallic fill material such as W, Ta, Ti, Co, Ru, Mo, etc. Although other suitable metallic fill materials are within the contemplated scope of disclosure. The thickness of the gate electrode layer 54L may be greater than one half of the maximum width of the at least one line trench 49. For example, the thickness of the gate electrode layer 54L may be in a range from 60 nm to 300 nm, such as from 100 nm to 200 nm, although lesser and greater thicknesses may also be used. Each line trench 49 may be filled with a respective downward-protruding portion of the gate electrode layer 54L.

Figure 9A:
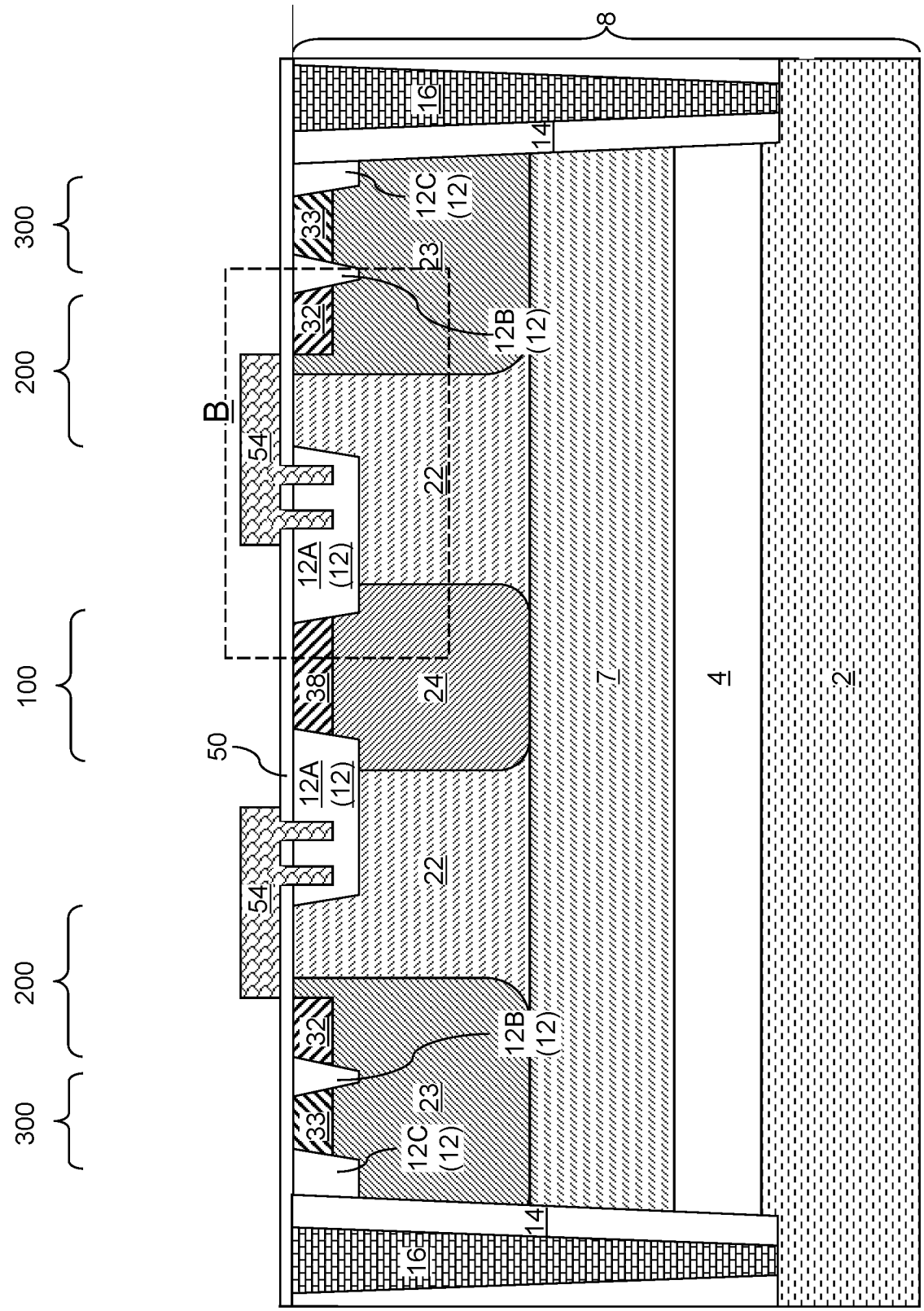
FIG. 9A is a vertical cross-sectional view of the exemplary structure after formation of gate electrodes according to an embodiment of the present disclosure.
Figure 9B:
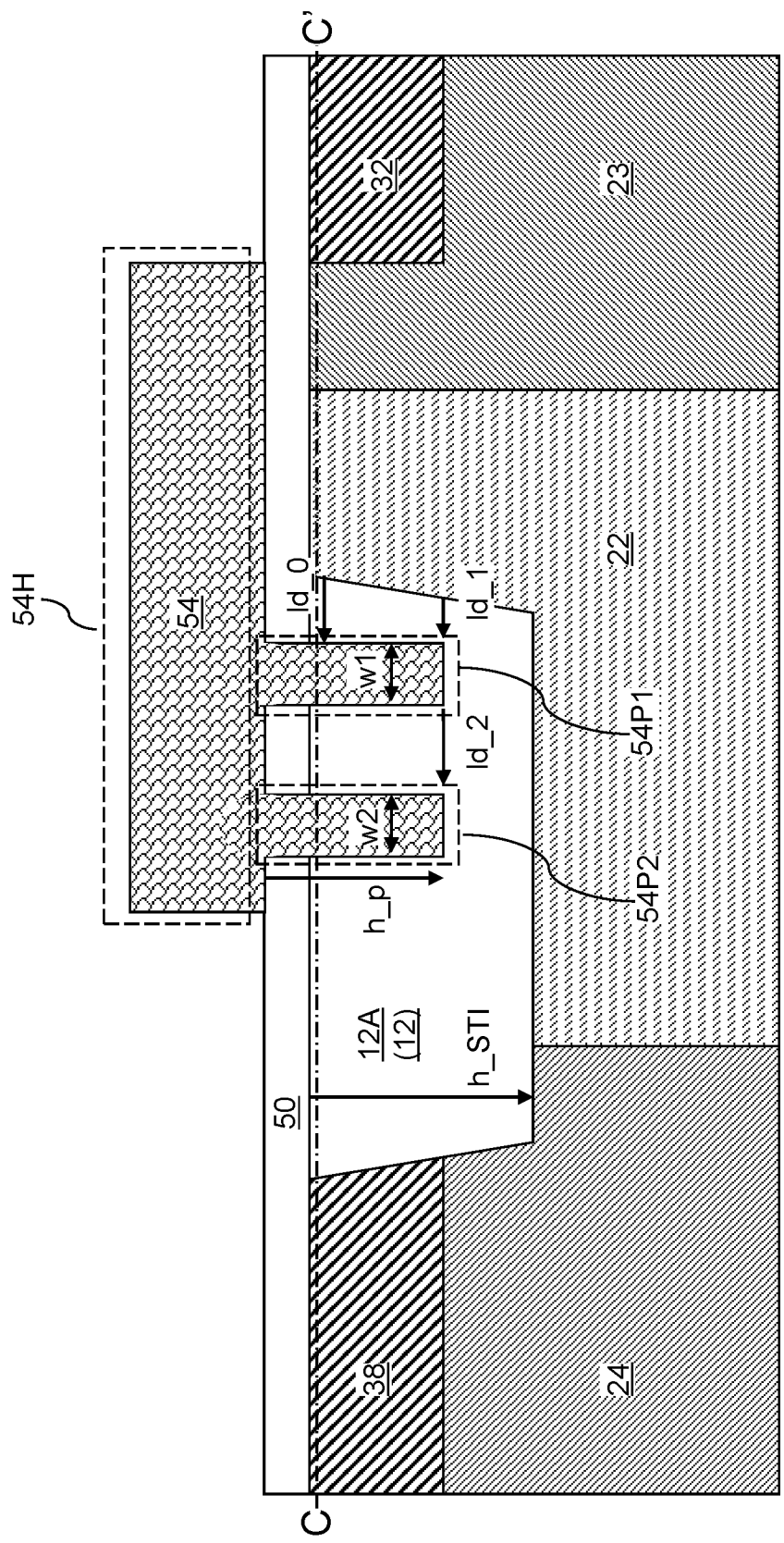
FIG. 9B is a magnified view of region B of FIG. 9A.

Referring to FIGS. 9A-9C, a photoresist layer (not shown) may be applied over the gate electrode layer 54L, and may be lithographically patterned to cover an area in which a gate electrode 54 is to be subsequently formed. Unmasked portions of the gate electrode layer 54L may be removed by performing an anisotropic etch process that uses the patterned photoresist layer as an etch mask. A patterned portion of the gate electrode layer 54L constitutes a gate electrode 54.

In one embodiment, the source region 32 and the drain region 38 may be laterally spaced apart along the first horizontal direction hd1, and a sidewall of the source region 32 contacting the source-side doped well 23 may be parallel to the second horizontal direction hd2. The lateral distance of a surface portion of the source-side doped well 23 located between an interface between the source-side doped well 23 and the source region 32 and an interface between the source-side doped well 23 and the intermediate doped well 22 constitutes a channel region. The channel length of the channel region along the first horizontal direction hd1 may be adjusted depending on the operation voltage of the field effect transistor, and may be in a range from 100 nm to 3,000 nm, such as from 300 nm to 1,000 nm, although lesser and greater channel lengths may also be used.

In one embodiment, a first widthwise sidewall of the gate electrode 54 may be located on, or in proximity to, a top edge of the interface between the source region 32 and the source-side doped well 23, and may be parallel to the second horizontal direction hd2. In one embodiment a second widthwise sidewall of the gate electrode 54 may be located entirely over the first shallow trench isolation portion 12A, and may be more proximal to the drain region 38 than the at least one line trench 49. A pair of lengthwise sidewalls of the gate electrode 54 may extend over the source-side doped well 23, an interface between the intermediate doped well 22 and the gate dielectric layer 50, and a region of the first shallow trench isolation portion 12A.

According to an aspect of the present disclosure, the gate electrode 54 comprises a horizontally-extending portion 54H overlying the gate dielectric layer 50 and at least one downward-protruding portion (54P1, 54P2) formed within the at least one line trench 49. The at least one downward-protruding portion (54P1, 54P2) overlies, and is vertically spaced from, the intermediate doped well 22. Specifically, the at least one downward-protruding portion (54P1, 54P2) overlies (i.e., is located above, and has an areal overlap in a plan view with) a first segment of a bottom surface of the first shallow trench isolation portion 12A that contacts the intermediate doped well 22.

In one embodiment, the source region 32 and the drain region 38 are laterally spaced apart along the first horizontal direction hd1, and each of the at least one downward-protruding portion (54P1, 54P2) of the gate electrode 54 is located within a respective line trench 49 that laterally extends through the first shallow trench isolation portion 12A along the second horizontal direction hd2 that is perpendicular to the first horizontal direction hd1. In one embodiment, each of the at least one downward-protruding portion (54P1, 54P2) of the gate electrode 54 has a respective uniform width (w1, w2) along the first horizontal direction hd1. The respective uniform width (w1, w2) is invariant under translation along the second horizontal direction hd2.

In one embodiment, the height h_STI of the shallow trench isolation structure 12 may be in a range from 150 nm to 800 nm, such as from 200 nm to 600 nm, and/or from 250 nm to 500 nm, although lesser and greater heights may also be used. The vertical distance between the bottom surface of each downward-protruding portion (54P1, 54P2) of the gate electrode 54 and a bottom surface of an underlying portion of the shallow trench isolation structure 12 may be in a range from 20% to 60% of the height h_STI of the shallow trench isolation structure. For example, the vertical distance between the bottom surface of each downward-protruding portion (54P1, 54P2) of the gate electrode 54 and a bottom surface of an underlying portion of the shallow trench isolation structure 12 may be in a range from 30 nm to 480 nm, such as from 60 nm to 360 nm, and/or from 120 nm to 300 nm, although lesser and greater vertical distances may also be used. The pillar height h_p of each downward-protruding portion (54P1, 54P2) of the gate electrode 54 may be in a range from 20% to 60% of the height h_STI of the shallow trench isolation structure. Thus, the pillar height h_p of each downward-protruding portion (54P1, 54P2) of the gate electrode 54 may be in a range from 60 nm to 650 nm, such as from 120 nm to 480 nm, and/or from 180 nm to 360 nm, although lesser and greater pillar heights may also be used.

In one embodiment, the minimum lateral distance between the at least one line trench and a top edge of an interface between the intermediate doped well 22 and the shallow trench isolation structure 12 (i.e., the first sidewall of the first shallow trench isolation portion 12A) that contacts the gate dielectric layer 50 may be less than the lateral distance between the at least one line trench 49 and the drain region 38. This minimum lateral distance is the reference lateral distance ld_0.

In one embodiment, the at least one downward-protruding portion (54P1, 54P2) comprises a plurality of downward-protruding portions (54P1, 54P2). Each of the plurality of downward-protruding portions (54P1, 54P2) has a respective width (w1, w2) in a range from 100 nm to 300 nm. For example, a first downward-protruding portion 54P1 and a second downward-protruding portion 54P2 (and optionally a third downward-protruding portion and/or a fourth downward-protruding portion, etc.) that are laterally spaced apart along the first horizontal direction hd1 may be provided. The first downward-protruding portion 54P1 may have a first width w1, and the second downward-protruding portion 54P2 may have a second width w2. The nearest neighbor spacing between the plurality of downward-protruding portions (54P1, 54P2) may be in a range from 100 nm to 300 nm. A lateral distance between the plurality of downward-protruding portions (54P1, 54P2) and a most proximal top edge of the first shallow trench isolation portion 12A may be in a range from 100 nm to 300 nm. For example, the first downward-protruding portion 54P1 may be laterally spaced from the most proximal top edge of the first shallow trench isolation portion 12A by the reference lateral distance ld_0 that is in a range from 100 nm to 300 nm. An edge of a bottom surface of first downward-protruding portion 54P1 may be laterally spaced from a tapered first sidewall of the first shallow trench isolation portion 12A by the first lateral distance ld_1, which is less than the reference lateral distance ld_0 and may be in a range from 50 nm to 150 nm. The second downward-protruding portion 54P2 may be laterally spaced from the first downward-protruding portion 54P1 by a second lateral distance ld_2, which may be in a range from 100 nm to 300 nm. Generally, the various dimensions of the high voltage field effect transistor can be optimized to prevent dielectric breakdown of the first shallow trench isolation portion 12A and to provide effective suppression of hot carriers and charge injection into the first shallow trench isolation portion 12A during operation of the high voltage field effect transistor.

Generally, the lateral distance between the at least one downward-protruding portion (54P1, 54P2) and the top edge of an interface between the intermediate doped well 22 and the shallow trench isolation structure 12 that contacts the gate dielectric layer 50 is less than the lateral distance between the at least one downward-protruding portion (54P1, 54P2) and the drain region 38.

In one embodiment, the shallow trench isolation structure 12 comprises an opening having a pair of lengthwise edges extending along the first horizontal direction hd1 and a pair of widthwise edges extending along the second horizontal direction hd2. The source region 32 and the drain region 38 are laterally spaced apart along the first horizontal direction hd1, and the at least one downward-protruding portion (54P1, 54P2) of the gate electrode 54 laterally extend along the second horizontal direction hd2 with a uniform width (w1, w2) along the first horizontal direction hd1 that is invariant under translation along the second horizontal direction hd2. In one embodiment, the at least one downward-protruding portion (54P1, 54P2) and the horizontally-extending portion 54H of the gate electrode 54 comprise, and/or consist of, a same conductive material. In one embodiment, each of the at least one downward-protruding portion (54P1, 54P2) is more proximal to the source region 32 than the drain region 38 is to the source region 32.

Figure 10A:
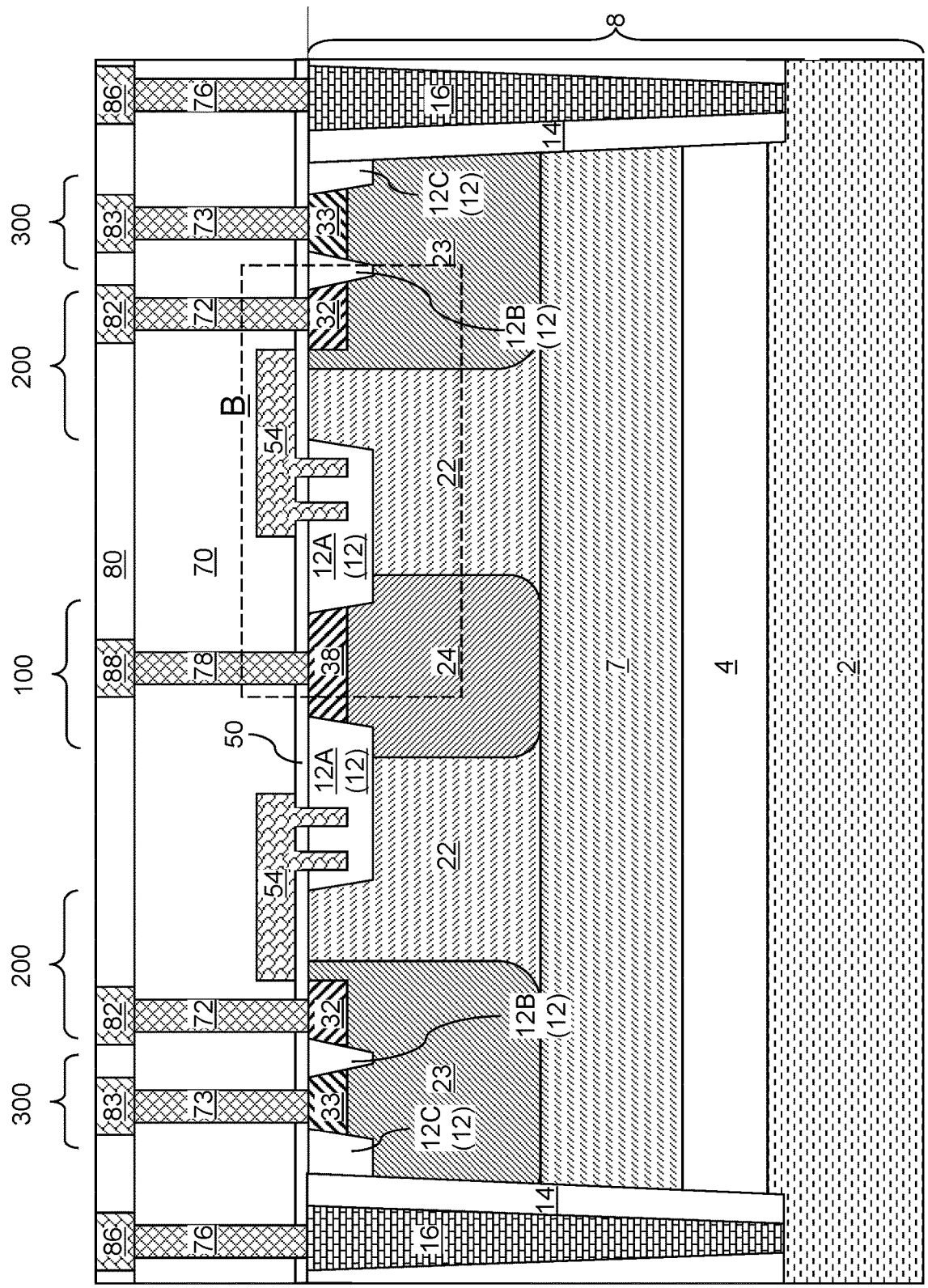
FIG. 10A is a vertical cross-sectional view of the exemplary structure after formation of a planarization dielectric layer, contact via structures, a line-level dielectric layer, and metal lines according to an embodiment of the present disclosure.
Figure 10B:
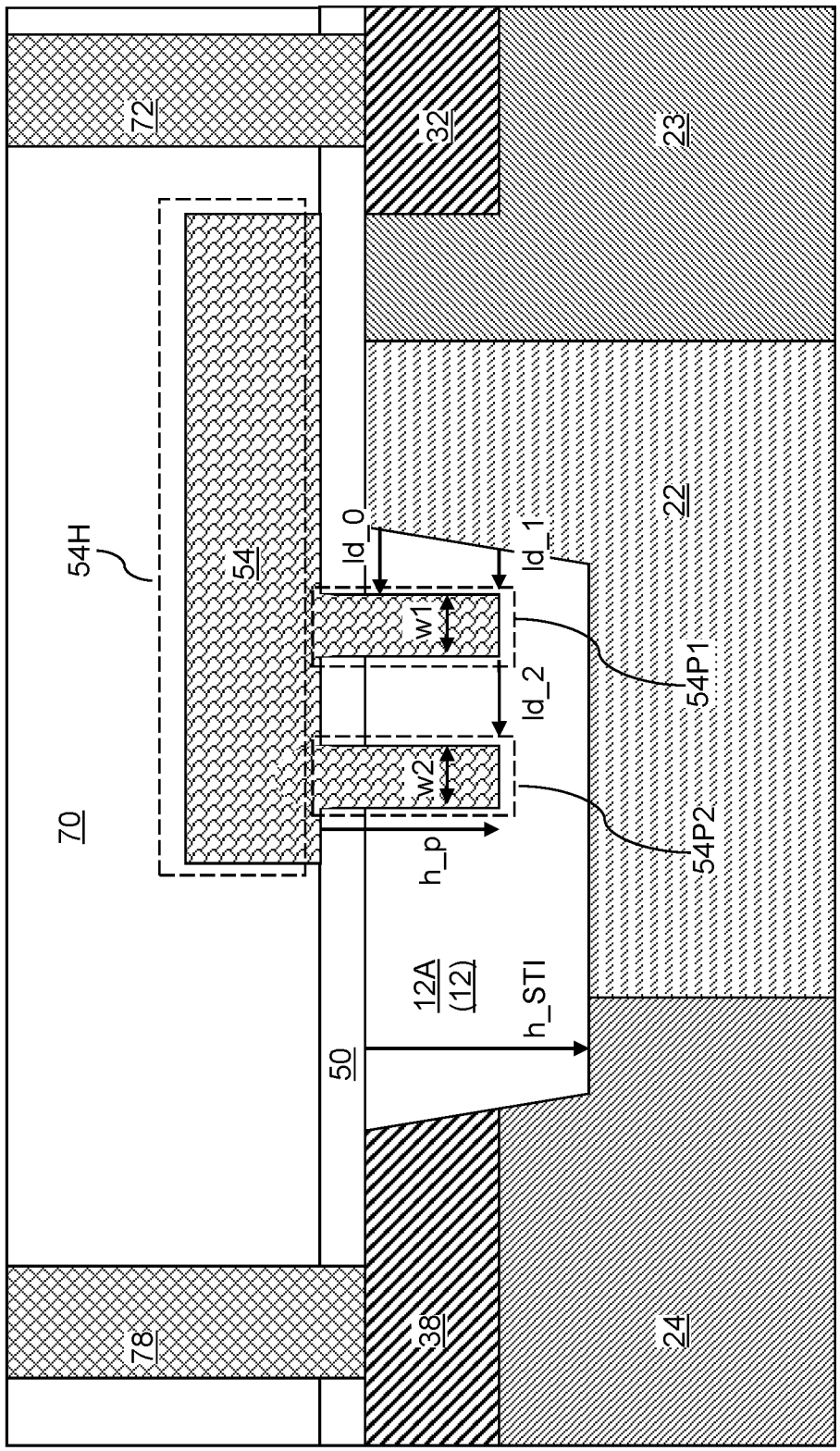
FIG. 10B is a magnified view of region B of FIG. 10A.

Referring to FIGS. 10A and 10B, a planarization dielectric layer 70 including a planarizable dielectric material such as silicon oxide may be deposited over the substrate 8 and each gate electrode 54. The top surface of the planarization dielectric layer 70 may be planarized, for example, by chemical mechanical polishing. Various contact via structures (72, 73, 76, 78) may be formed through the planarization dielectric layer 70 on a top surface of a respective conductive structure. For example, a source contact via structure 72 may be formed on a top surface of each source region 32. A drain contact via structure 78 may be formed on a top surface of the drain region 38. A body contact via structure 73 may be formed on a top surface of each body contact region 33. A substrate connection via structure 76 may be formed on a top surface of each substrate contact via structure 16.

A line-level dielectric layer 80 may be deposited over the planarization dielectric layer 70, and various metal lines (82, 83, 86, 88) may be formed in the line-level dielectric layer 80. For example, the metal lines (82, 83, 86, 88) may include at least one source connection metal line 82 contacting a top surface of a respective source contact via structure 72, a drain connection metal line 88 contacting a top surface of the drain contact via structure 78, at least one body connection metal line 83 contacting a top surface of a respective body contact via structure 73, and at least one substrate connection metal line 86 contacting a top surface of a respective substrate connection via structure 76.

Within the exemplary structure of FIGS. 10A and 10B, the upper portion of the intermediate doped well 22 that are proximal to the gate dielectric layer 50 and the first shallow trench isolation portion 12A may function as a drift region during operation of the field effect transistor. Charge carriers drift toward the drain region 38 within the drift region without further increase in speed.

A two-dimensional simulation performed on the exemplary structure of the present disclosure and performed on a comparative exemplary structure derived from the exemplary structure of the present disclosure by omission of each downward-protruding portion (54P1, 54P2) of the gate electrode 54 displayed potential lines and a hot carrier region 99. Comparison of the simulation results showed that the crowding potential lines may be relieved in the drift region located in an upper portion of the intermediate doped well 22 within the exemplary structure of the present disclosure as compared to the comparative exemplary structure that omits the downward-protruding portion (54P1, 54P2) of the gate electrode 54. Further, the two-dimensional simulation illustrated that the impact ionization rate may be reduced by a factor of about 10 within the exemplary structure of the present disclosure as compared to the comparative exemplary structure that omits the downward-protruding portion (54P1, 54P2) of the gate electrode 54.

Figure 11A:
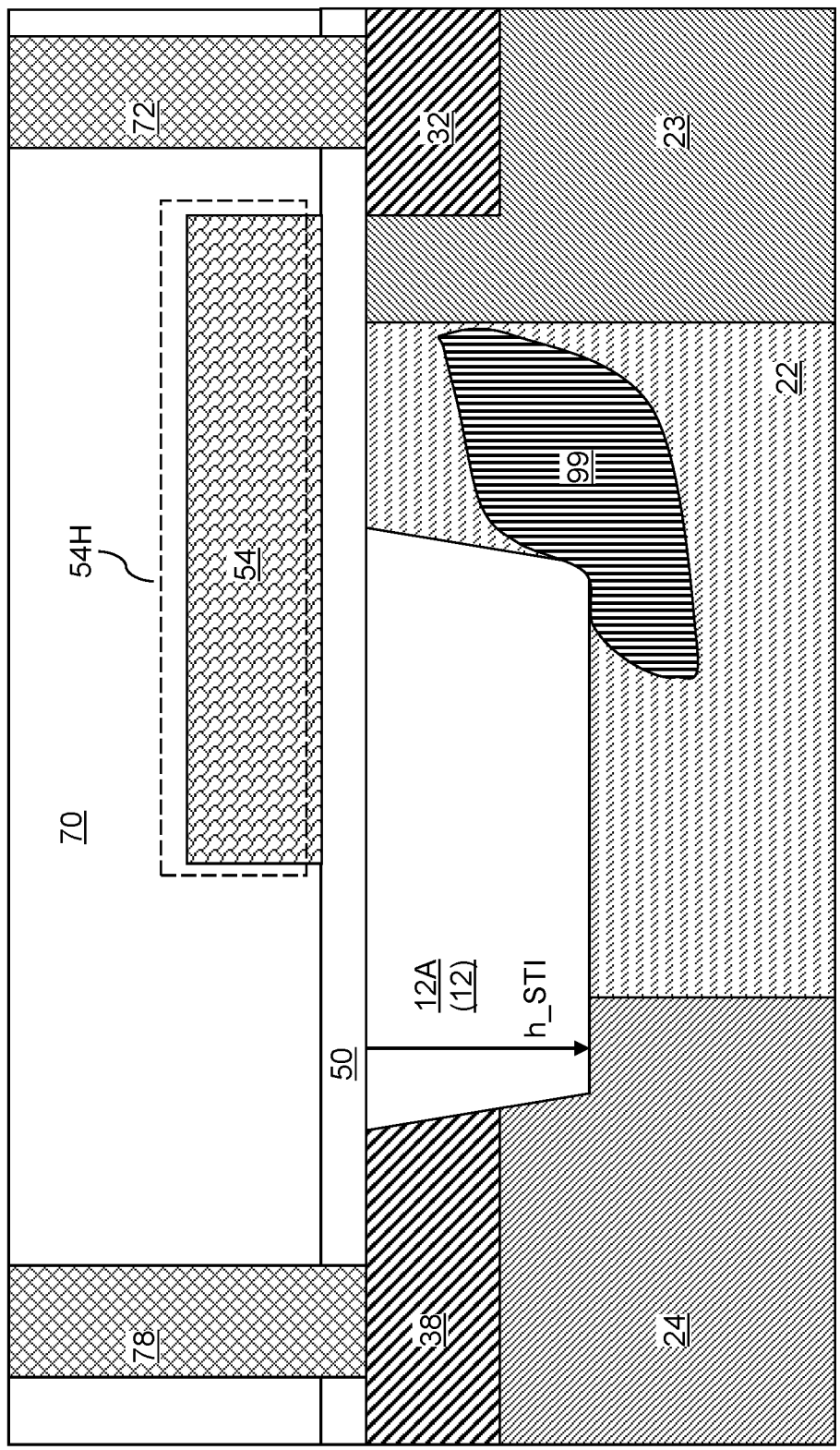
FIG. 11A is a vertical cross-sectional view of the exemplary structure illustrating a hot carrier region in a comparative exemplary field effect transistor that does not use a downward-protruding portion in a gate electrode.
Figure 11B:
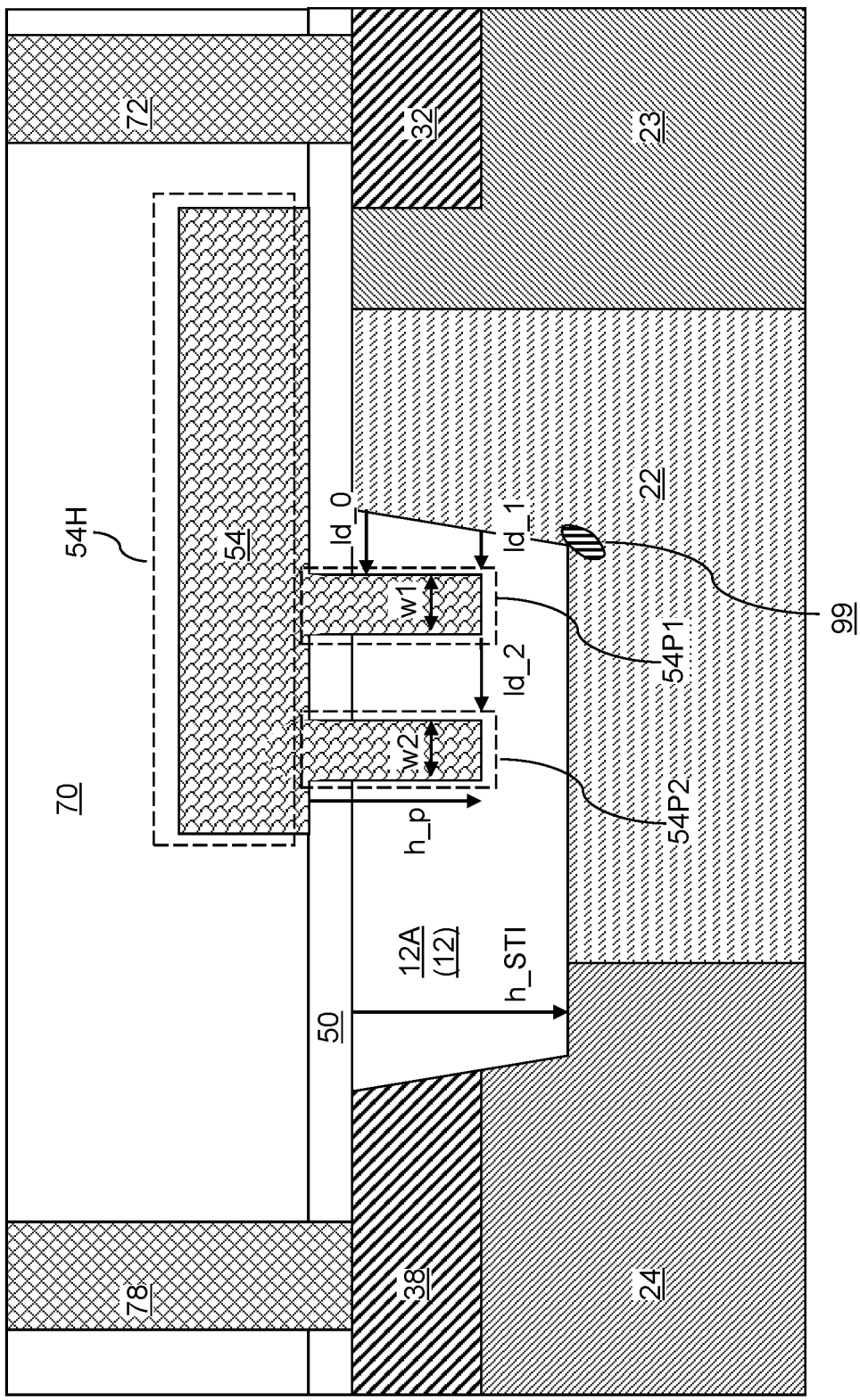
FIG. 11B is a vertical cross-sectional view of the exemplary structure illustrating a hot carrier region in the exemplary field effect transistor according to an embodiment of the present disclosure.

FIG. 11A schematically illustrates a hot carrier region 99 in a comparative exemplary field effect transistor that does not use a downward-protruding portion in a gate electrode 54. FIG. 11B is a schematic diagram illustrating a hot carrier region 99 in the exemplary field effect transistor according to an embodiment of the present disclosure. The comparative exemplary field effect transistor is derived from the inventive exemplary field effect transistor of the present disclosure for the express purpose of quantifying the effects of the presence of the at least one downward-protruding portion (54P1, 54P2), and as such, shall not be construed as a prior art device. Comparison of FIGS. 11A and 11B clearly shows a significant reduction in the volume of the hot carrier region 99 due to the field effect from the downward-protruding portions (54P1, 54P2) of the gate electrode 54.

Referring collective to FIGS. 1-11B, a field effect transistor is provided, which may include: a semiconductor material layer (22, 23, 24, 7, 32, 33, 38) including a source-side doped well 23 having a doping of a first conductivity type, a source region 32 having a doping of a second conductivity type that is an opposite of the first conductivity type and embedded in the source-side doped well 23, and a drain region 38 having a doping of the second conductivity type and laterally spaced from the source region 32; a shallow trench isolation structure 12 embedded in the semiconductor material layer (22, 23, 24, 7, 32, 33, 38) and may include a portion located between the source region 32 and the drain region 38; a gate dielectric layer 50 overlying the semiconductor material layer (22, 23, 24, 7, 32, 33, 38); and a gate electrode 54 that may include a horizontally-extending portion 54H that overlies the gate dielectric layer 50 and at least one downward-protruding portion (54P1, 54P2) that extends downward from a bottom surface of the horizontally-extending portion 54H into an upper region of the shallow trench isolation structure 12 and vertically spaced from a bottom surface of the shallow trench isolation structure 12.

In one embodiment, the field effect transistor may also include an intermediate doped well located between the source-side doped well and the drain region and having a doping of the second conductivity type, wherein the at least one downward-protruding portion overlies a first segment of a bottom surface of the shallow trench isolation structure that contacts the intermediate doped well.

In one embodiment, a first sidewall of the shallow trench isolation structure may extend from the first segment of the bottom surface of the shallow trench isolation structure to a bottom surface of the gate dielectric layer.

In one embodiment, the gate dielectric layer may contact an upper edge of an interface between the source-side doped well and the intermediate doped well.

In one embodiment, the field effect transistor may also include a drain-side doped well having a doping of the second conductivity type, contacting a bottom surface of the drain region, and contacting a sidewall of the intermediate doped well and a second segment of the bottom surface of the shallow trench isolation structure.

In one embodiment, an average atomic concentration of dopants of the second conductivity type in the drain-side doped well may be greater than an average atomic concentration of dopants of the second conductivity type conductivity type in the intermediate doped well and may be less than an average atomic concentration of dopants of the second conductivity type in the drain region.

In one embodiment, the drain region may be located within a first opening in a first portion of the shallow trench isolation structure and an entirety of all sidewalls of the drain region contacts the shallow trench isolation structure; and the source region may be located within a second opening in a second portion of the shallow trench isolation structure and a sidewall of the source region may contact the source-side doped well and another sidewall of the source region may contact the second portion of the shallow trench isolation structure.

In one embodiment, the field effect transistor may also include a buried doped semiconductor layer having a doping of the first conductivity type and that may contact a bottom surface of the source-side doped well; a buried insulating layer that may underlie the buried doped semiconductor layer; a body contact region that may contact a top portion of the source-side doped well and may have a doping of the first conductivity type and including dopants of the first conductivity type at a higher atomic concentration than the source-side doped well.

In one embodiment, the field effect transistor may also include a substrate semiconductor layer that may underlie the buried insulating layer; a deep trench isolation structure that may include a dielectric material and may vertically extend through the semiconductor material layer; and a substrate contact via structure that may vertically extend through the deep trench isolation structure and may contact a semiconductor material within the substrate semiconductor layer.

In one embodiment, the source region and the drain region may be laterally spaced apart along a first horizontal direction; each of the at least one downward-protruding portion of the gate electrode may be located within a respective line trench that may laterally extend through the shallow trench isolation structure along a second horizontal direction that is perpendicular to the first horizontal direction; and each of the at least one downward-protruding portion of the gate electrode may have a respective uniform width along the first horizontal direction that may be invariant under translation along the second horizontal direction.

In one embodiment, the at least one downward-protruding portion of the gate electrode may include a plurality of downward-protruding portions; each of the plurality of downward-protruding portions may have a respective width in a range from 100 nm to 300 nm; a nearest neighbor spacing between the plurality of downward-protruding portions may be in a range from 100 nm to 300 nm; and a lateral distance between the plurality of downward-protruding portion and a most proximal top edge of the shallow trench isolation structure may be in a range from 100 nm to 300 nm.

According to an aspect of the present disclosure, a semiconductor structure is provided, which may include: a buried doped semiconductor layer 7 having a doping of a first conductivity type; semiconductor material portions (22, 23, 24, 7, 32, 33, 38) overlying the buried doped semiconductor layer 7 and may include a source-side doped well 23 having a doping of the first conductivity type, a source region 32 having a doping of a second conductivity type that is an opposite of the first conductivity type, an intermediate doped well 22 having a doping of the second conductivity type and contacting a sidewall of the source-side doped well 23, and a drain region 38 that is laterally spaced from the source-side doped well 23 by the intermediate doped well 22 and having a doping of the second conductivity type; a shallow trench isolation structure 12 embedded in an upper region of the semiconductor material portions (22, 23, 24, 7, 32, 33, 38) and overlying a sidewall and a recessed horizontal surface of the intermediate doped well 22; a gate dielectric layer 50 overlying the source region 32 and the source-side doped well 23; and a gate electrode 54 that may include a horizontally-extending portion 54H that overlies the gate dielectric layer 50 and at least one downward-protruding portion (54P1, 54P2) that extends downward from a bottom surface of the horizontally-extending portion 54H into an upper region of the shallow trench isolation structure 12 and vertically spaced from the recessed horizontal surface of the intermediate doped well 22.

In one embodiment, the semiconductor structure may also include a drain-side doped well having a doping of the second conductive type and may contact a bottom surface of the drain region and a sidewall of the intermediate doped well, wherein a sidewall of the shallow trench isolation structure may contact a sidewall of the drain region and a sidewall of the drain-side doped well.

In one embodiment, the shallow trench isolation structure may include an opening having a pair of lengthwise edges extending along a first horizontal direction and a pair of widthwise edges extending along a second horizontal direction that is perpendicular to the first horizontal direction; the source region and the drain region may be laterally spaced apart along the first horizontal direction; and the at least one downward-protruding portion of the gate electrode may laterally extend along the second horizontal direction with a uniform width along the first horizontal direction that is invariant under translation along the second horizontal direction.

In one embodiment, the at least one downward-protruding portion and the horizontally-extending portion of the gate electrode may include the same conductive material; a vertical distance between a horizontal bottom surface of each of the at least one downward-protruding portion and the recessed horizontal surface of the intermediate doped well that may be in a range from 20% to 60% of a height of the shallow trench isolation structure; and each of the at least one downward-protruding portion may be more proximal to the source region than the drain region is to the source region. The lower limit on the vertical distance between the horizontal bottom surface of each of the at least one downward-protruding portion and the recessed horizontal surface of the intermediate doped well is determined by the requirement that the portion of the shallow trench isolation structure 12 located between the horizontal bottom surface of each of the at least one downward-protruding portion and the recessed horizontal surface of the intermediate doped well does not suffer dielectric break down during operation of the high voltage field effect transistor. The upper limit on the vertical distance between the horizontal bottom surface of each of the at least one downward-protruding portion and the recessed horizontal surface of the intermediate doped well is imposed by the requirement that the at least one downward-protruding portion effectively alters electrical field thereabout during operation of the high voltage field effect transistor.

Figure 12:
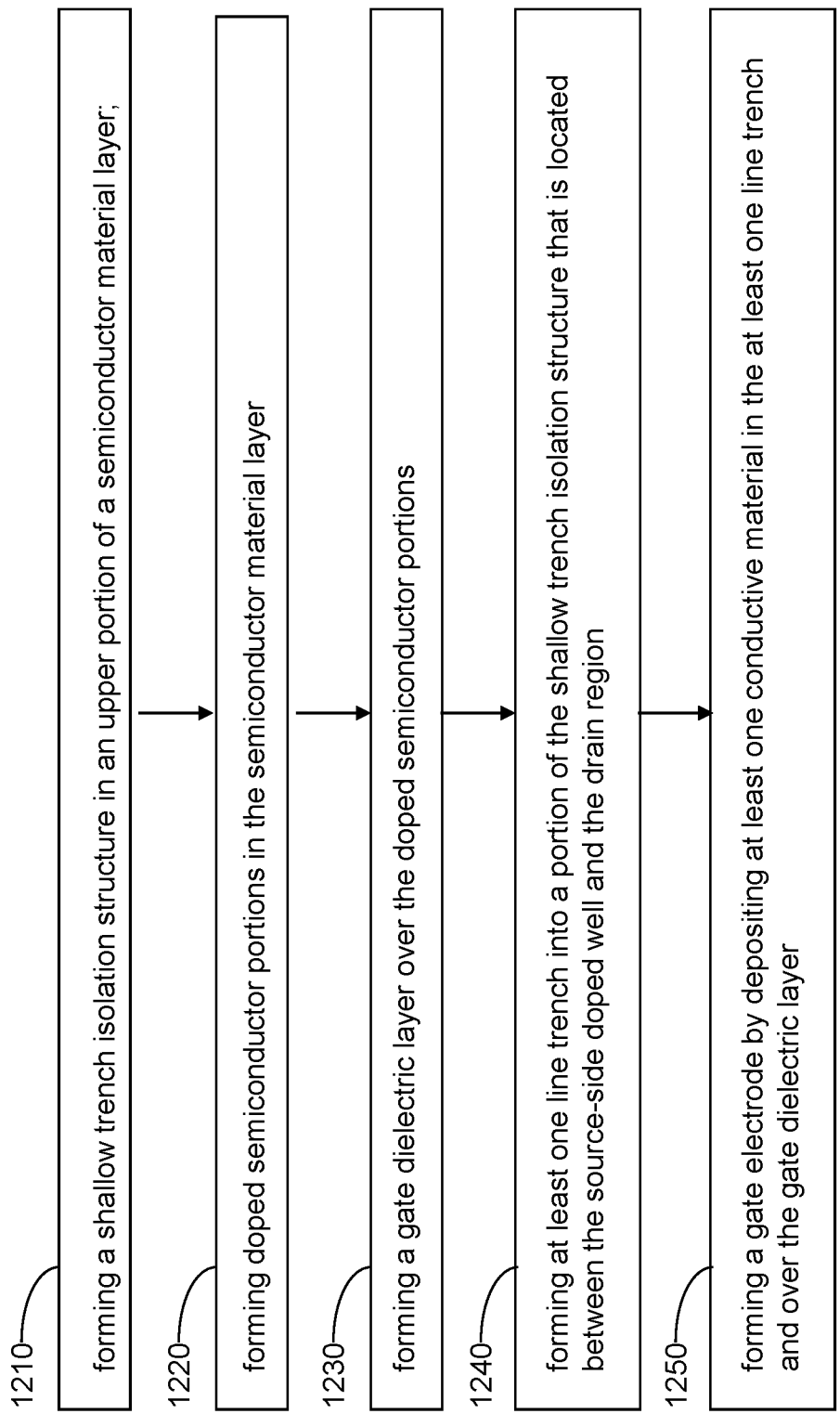
FIG. 12 is a flow chart illustrating a general sequence of processing steps that may be used to form a high voltage field effect transistor of the present disclosure.

Referring to FIG. 12, a general sequence of processing steps that may be used to form a high voltage field effect transistor of the present disclosure is illustrated. Referring to step 1210 and FIGS. 1 and 2, a shallow trench isolation structure 12 may be formed in an upper portion of a semiconductor material layer 6. Referring to step 1220 and FIGS. 3-6C, doped semiconductor portions (22, 23, 24, 7, 32, 33, 38) may be formed in the semiconductor material layer 6. The doped semiconductor portions (22, 23, 24, 7, 32, 38, 33) may include a source-side doped well 23 having a doping of a first conductivity type, a source region 32 having a doping of a second conductivity type that is an opposite of the first conductivity type and embedded in the source-side doped well 23, and a drain region 38 having a doping of the second conductivity type and laterally spaced from the source region 32 by the shallow trench isolation structure 12.

Referring to step 1230 and FIG. 7A-7C, a gate dielectric layer 50 may be formed over the doped semiconductor portions (22, 23, 24, 7, 32, 33, 38). Referring to step 1240 and FIGS. 7A-7C, at least one line trench 49 may be formed into a portion of the shallow trench isolation structure 12 that is located between the source-side doped well 23 and the drain region 38. Referring to step 1250 and FIGS. 8A-11B, a gate electrode 54 may be formed by depositing at least one conductive material in the at least one line trench 49 and over the gate dielectric layer 50. The gate electrode 54 comprises a horizontally-extending portion 54H overlying the gate dielectric layer 50 and at least one downward-protruding portion (54P1, 54P2) formed within the at least one line trench 49.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field effect transistor comprising:
a semiconductor material layer including a source-side doped well having a doping of a first conductivity type, a source region having a doping of a second conductivity type that is an opposite of the first conductivity type and embedded in the source-side doped well, and a drain region having a doping of the second conductivity type and laterally spaced from the source region;
a shallow trench isolation structure embedded in the semiconductor material layer and comprising a portion located between the source region and the drain region;
a gate dielectric layer overlying the semiconductor material layer;
a gate electrode comprising a horizontally-extending portion that overlies the gate dielectric layer and at least one downward-protruding portion that extends downward from a bottom surface of the horizontally-extending portion into an upper region of the shallow trench isolation structure and vertically spaced from a bottom surface of the shallow trench isolation structure;
an intermediate doped well located between the source-side doped well and the drain region and having a doping of the second conductivity type, wherein the at least one downward-protruding portion overlies a first segment of a bottom surface of the shallow trench isolation structure that contacts the intermediate doped well; and
a drain-side doped well having a doping of the second conductivity type, contacting a bottom surface of the drain region, and contacting a sidewall of the intermediate doped well and a second segment of the bottom surface of the shallow trench isolation structure, wherein:
the drain region is located within a first opening in a first portion of the shallow trench isolation structure and an entirety of all sidewalls of the drain region contacts the shallow trench isolation structure; and
the source region is located within a second opening in a second portion of the shallow trench isolation structure and a sidewall of the source region contacts the source-side doped well and another sidewall of the source region contacts the second portion of the shallow trench isolation structure.

2. The field effect transistor of claim 1, wherein a first sidewall of the shallow trench isolation structure extends from the first segment of the bottom surface of the shallow trench isolation structure to a bottom surface of the gate dielectric layer.

3. The field effect transistor of claim 1, wherein the gate dielectric layer contacts an upper edge of an interface between the source-side doped well and the intermediate doped well.

4. The field effect transistor of claim 1, wherein an average atomic concentration of dopants of the second conductivity type in the drain-side doped well is greater than an average atomic concentration of dopants of the second conductivity type conductivity type in the intermediate doped well and is less than an average atomic concentration of dopants of the second conductivity type in the drain region.

5. The field effect transistor of claim 1, further comprising:
a buried doped semiconductor layer having a doping of the first conductivity type and contacting a bottom surface of the source-side doped well;
a buried insulating layer underlying the buried doped semiconductor layer;
a body contact region contacting a top portion of the source-side doped well and having a doping of the first conductivity type and including dopants of the first conductivity type at a higher atomic concentration than the source-side doped well.

6. The field effect transistor of claim 5, further comprising:
a substrate semiconductor layer underlying the buried insulating layer;
a deep trench isolation structure comprising a dielectric material and vertically extending through the semiconductor material layer; and
a substrate contact via structure vertically extending through the deep trench isolation structure and contacting a semiconductor material within the substrate semiconductor layer.

7. The field effect transistor of claim 1, wherein:
the source region and the drain region are laterally spaced apart along a first horizontal direction;
each of the at least one downward-protruding portion of the gate electrode is located within a respective line trench that laterally extends through the shallow trench isolation structure along a second horizontal direction that is perpendicular to the first horizontal direction; and
each of the at least one downward-protruding portion of the gate electrode has a respective uniform width along the first horizontal direction that is invariant under translation along the second horizontal direction.

8. The field effect transistor of claim 1, wherein:
the at least one downward-protruding portion of the gate electrode comprises a plurality of downward-protruding portions;
each of the plurality of downward-protruding portions has a respective width in a range from 100 nm to 300 nm;
a nearest neighbor spacing between the plurality of downward-protruding portions is in a range from 100 nm to 300 nm; and
a lateral distance between the plurality of downward-protruding portion and a most proximal top edge of the shallow trench isolation structure is in a range from 100 nm to 300 nm.

9. A semiconductor structure comprising:
a buried doped semiconductor layer having a doping of a first conductivity type;
semiconductor material portions overlying the buried doped semiconductor layer and comprising a source-side doped well having a doping of the first conductivity type, a source region having a doping of a second conductivity type that is an opposite of the first conductivity type, an intermediate doped well having a doping of the second conductivity type and contacting a sidewall of the source-side doped well, and a drain region that is laterally spaced from the source-side doped well by the intermediate doped well and having a doping of the second conductivity type;
a shallow trench isolation structure embedded in an upper region of the semiconductor material portions and overlying a sidewall and a recessed horizontal surface of the intermediate doped well;

a gate dielectric layer overlying the source region and the source-side doped well; and
a gate electrode comprising a horizontally-extending portion that overlies the gate dielectric layer and at least one downward-protruding portion that extends downward from a bottom surface of the horizontally-extending portion into an upper region of the shallow trench isolation structure and vertically spaced from the recessed horizontal surface of the intermediate doped well; and
a drain-side doped well having a doping of the second conductive type and contacting a bottom surface of the drain region and a sidewall of the intermediate doped well, wherein a sidewall of the shallow trench isolation structure contacts a sidewall of the drain region and a sidewall of the drain-side doped well, wherein:
the drain region is located within a first opening in a first portion of the shallow trench isolation structure and an entirety of all sidewalls of the drain region contacts the shallow trench isolation structure; and
the source region is located within a second opening in a second portion of the shallow trench isolation structure and a sidewall of the source region contacts the source-side doped well and another sidewall of the source region contacts the second portion of the shallow trench isolation structure.

10. The semiconductor structure of claim 9, wherein:
the shallow trench isolation structure comprises an opening having a pair of lengthwise edges extending along a first horizontal direction and a pair of widthwise edges extending along a second horizontal direction that is perpendicular to the first horizontal direction;
the source region and the drain region are laterally spaced apart along the first horizontal direction; and
the at least one downward-protruding portion of the gate electrode laterally extend along the second horizontal direction with a uniform width along the first horizontal direction that is invariant under translation along the second horizontal direction.

11. The semiconductor structure of claim 9, wherein:
the at least one downward-protruding portion and the horizontally-extending portion of the gate electrode comprise a same conductive material;
a vertical distance between a horizontal bottom surface of each of the at least one downward-protruding portion and the recessed horizontal surface of the intermediate doped well is in a range from 20% to 60% of a height of the shallow trench isolation structure; and
each of the at least one downward-protruding portion is more proximal to the source region than the drain region is to the source region.

12. A field effect transistor comprising:
a semiconductor material layer including a source-side doped well having a doping of a first conductivity type, a source region having a doping of a second conductivity type that is an opposite of the first conductivity type and embedded in the source-side doped well, and a drain region having a doping of the second conductivity type and laterally spaced from the source region, an intermediate doped well located between the source-side doped well and the drain region and having a doping of the second conductivity type;
a shallow trench isolation structure embedded in the semiconductor material layer and comprising a portion located between the source region and the drain region;
a gate dielectric layer overlying the semiconductor material layer;
a gate electrode comprising a horizontally-extending portion that overlies the gate dielectric layer and at least one downward-protruding portion that extends downward from a bottom surface of the horizontally-extending portion into an upper region of the shallow trench isolation structure; and
a drain-side doped well having a doping of the second conductivity type, contacting a bottom surface of the drain region, and contacting a sidewall of the intermediate doped well and a second segment of the bottom surface of the shallow trench isolation structure,
wherein the at least one downward-protruding portion overlies a first segment of a bottom surface of the shallow trench isolation structure that contacts the intermediate doped well; and
wherein the drain region is located within a first opening in a first portion of the shallow trench isolation structure and an entirety of all sidewalls of the drain region contacts the shallow trench isolation structure.

13. The field effect transistor of claim 12, wherein the gate dielectric layer contacts a top surface of the intermediate doped well.

14. The field effect transistor of claim 12, wherein the gate dielectric layer contacts an upper edge of an interface between the source-side doped well and the intermediate doped well.

15. The field effect transistor of claim 12, wherein:
the source region and the drain region are laterally spaced apart along a first horizontal direction;
each of the at least one downward-protruding portion of the gate electrode is located within a respective line trench that laterally extends through the shallow trench isolation structure along a second horizontal direction that is perpendicular to the first horizontal direction; and
each of the at least one downward-protruding portion of the gate electrode has a respective uniform width along the first horizontal direction that is invariant under translation along the second horizontal direction.

16. The field effect transistor of claim 12, wherein the source region is located within a second opening in a second portion of the shallow trench isolation structure and a sidewall of the source region contacts the source-side doped well and another sidewall of the source region contacts the second portion of the shallow trench isolation structure.

17. The semiconductor structure of claim 9, wherein an average atomic concentration of dopants of the second conductivity type in the drain-side doped well is greater than an average atomic concentration of dopants of the second conductivity type conductivity type in the intermediate doped well and is less than an average atomic concentration of dopants of the second conductivity type in the drain region.

18. The semiconductor structure of claim 1, further comprising:
a planarization dielectric layer overlying the gate dielectric layer;
a source contact via structure vertically extending through the planarization dielectric layer and the gate dielectric layer and contacting a top surface of the source region; and
a drain contact via structure vertically extending through the planarization dielectric layer and the gate dielectric layer and contacting a top surface of the drain region, wherein the gate dielectric layer continuous extends over, and is in direct contact with each of, the source region, the source-side doped well, the an intermediate doped well, and the drain region.

19. The semiconductor structure of claim 18, wherein:
the source contact via structure is in direct contact with a first cylindrical surface segment of the gate dielectric layer; and
the drain contact via structure is in direct contact with a second cylindrical surface segment of the gate dielectric layer.

20. The field effect transistor of claim 1, further comprising:
   a buried doped semiconductor layer having a doping of the first conductivity type and contacting a bottom surface of the source-side doped well;
   a buried insulating layer underlying the buried doped semiconductor layer;
   a substrate semiconductor layer underlying the buried insulating layer;
   a deep trench isolation structure comprising a dielectric material and vertically extending through the semiconductor material layer; and
   a substrate contact via structure vertically extending through the deep trench isolation structure and contacting a semiconductor material within the substrate semiconductor layer,
   wherein the gate dielectric layer continuous extends over, and is in direct contact with each of, the source region, the source-side doped well, the an intermediate doped well, the drain region, the deep trench isolation structure, and the substrate contact structure.

* * * * *